(12) United States Patent
He et al.

(10) Patent No.: US 11,960,398 B2
(45) Date of Patent: Apr. 16, 2024

(54) ENHANCED DATA RELIABILITY IN MULTI-LEVEL MEMORY CELLS

(71) Applicant: Micron Technology, Inc., Boise, ID (US)

(72) Inventors: Deping He, Boise, ID (US); David Aaron Palmer, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 236 days.

(21) Appl. No.: 16/999,985

(22) Filed: Aug. 21, 2020

(65) Prior Publication Data

US 2022/0058124 A1 Feb. 24, 2022

(51) Int. Cl.
| | | |
|---|---|---|
| G06F 12/00 | (2006.01) | |
| G06F 11/10 | (2006.01) | |
| G06F 11/30 | (2006.01) | |
| G06F 12/0811 | (2016.01) | |
| G06F 12/0882 | (2016.01) | |
| G06F 12/0891 | (2016.01) | |

(52) U.S. Cl.
CPC ...... *G06F 12/0811* (2013.01); *G06F 11/1068* (2013.01); *G06F 11/3037* (2013.01); *G06F 12/0882* (2013.01); *G06F 12/0891* (2013.01)

(58) Field of Classification Search
CPC ........ G06F 3/06; G06F 11/1446; G06F 12/00; G06F 13/16; G06F 12/0811; G06F 11/1068; G06F 11/3037; G06F 12/0882; G06F 12/0891; G06F 11/1072; G11C 11/5621; G11C 11/5657; G11C 16/3418; G11C 29/74; G11C 11/5628; G11C 11/5642; G11C 7/1006
See application file for complete search history.

(56) References Cited

U.S. PATENT DOCUMENTS

| | | | | |
|---|---|---|---|---|
| 2010/0235715 | A1* | 9/2010 | Thatcher | G11C 16/26 714/763 |
| 2012/0023283 | A1* | 1/2012 | Yang | G06F 12/0246 711/E12.008 |
| 2015/0364191 | A1* | 12/2015 | Muralimanohar | G11C 16/10 365/163 |
| 2017/0317693 | A1* | 11/2017 | Yang | H03M 13/611 |
| 2021/0303203 | A1* | 9/2021 | Eliash | G06F 11/1048 |

\* cited by examiner

*Primary Examiner* — Arvind Talukdar
(74) *Attorney, Agent, or Firm* — Holland & Hart LLP

(57) ABSTRACT

Methods, systems, and devices for enhanced data reliability in multi-level memory cells are described. For a write operation, a host device may identify a first set of data to be stored by a set of memory cells at a memory device. Based on a quantity of bits within the first set of data being less than a storage capacity of the set of memory cells, the host device may generate a second set of data and transmit a write command including the first and second sets of data to the memory device. For a read operation, the host device may receive a first set of data from the memory device in response to transmitting a read command. The memory device may extract a second set of data from the first set of data and validate a portion of the first set of data using the second set of data.

11 Claims, 13 Drawing Sheets

US 11,960,398 B2

ENHANCED DATA RELIABILITY IN MULTI-LEVEL MEMORY CELLS

BACKGROUND

The following relates generally to one or more memory systems and more specifically to enhanced data reliability in multi-level memory cells.

Memory devices are widely used to store information in various electronic devices such as computers, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), 3-dimensional cross-point memory (3D Xpoint), Flash memory (such as floating-gate Flash and charge-trapping Flash, which may be used in not-or (NOR) or not-and (NAND) memory devices), and others. Memory devices may be volatile or non-volatile. Non-volatile memory cells, e.g., such as flash memory cells, may maintain their stored logic state for extended periods of time even in the absence of an external power source. Volatile memory cells, e.g., DRAM cells, may lose their stored state over time unless they are periodically refreshed by an external power source. Flash-based memory devices may have different performance compared to other non-volatile and volatile memory devices.

DETAILED DESCRIPTION

Figure 1:
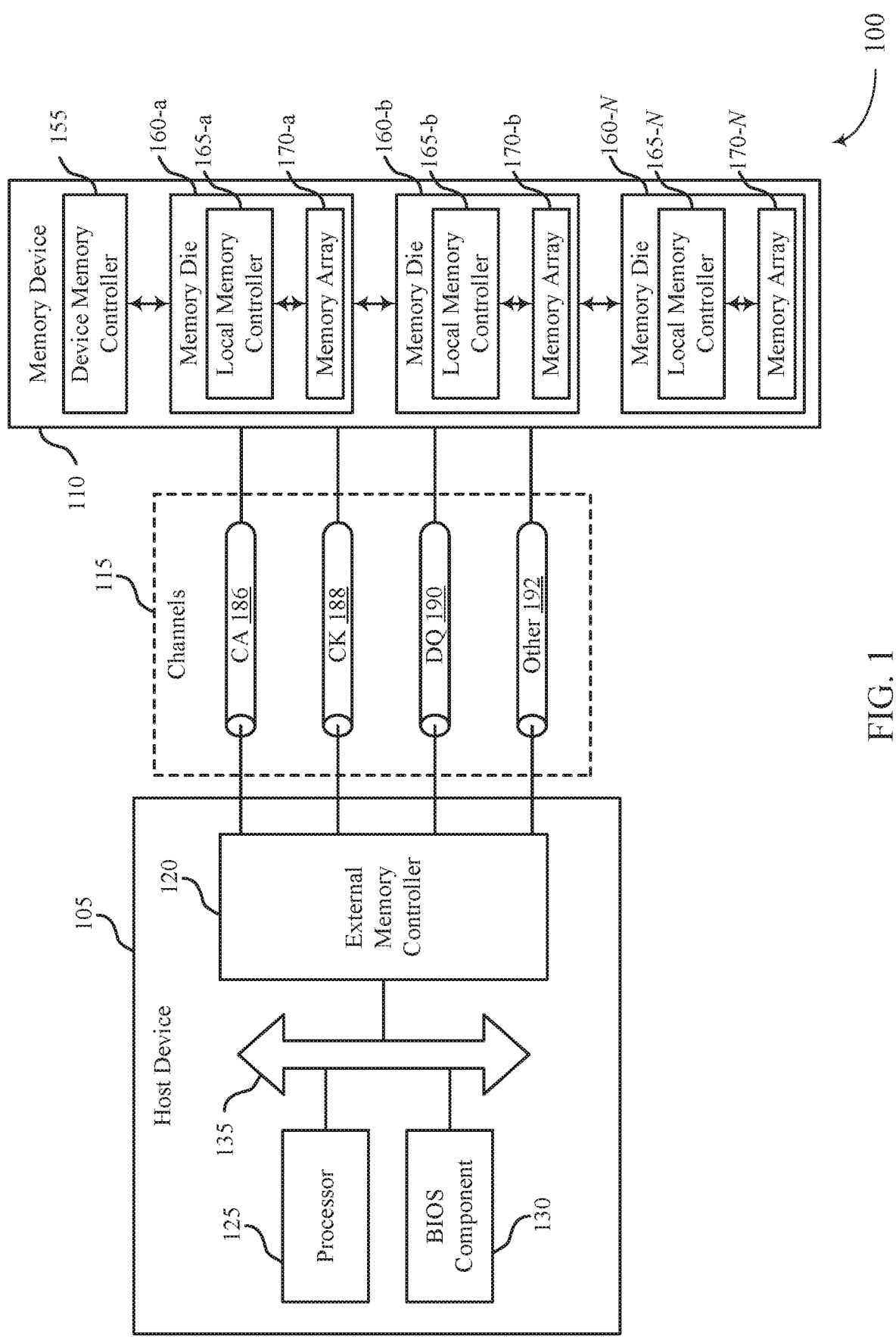
FIG. 1 illustrates an example of a system that supports enhanced data reliability in multi-level memory cells in accordance with examples as disclosed herein.

Some types of memory cells are capable of storing a single bit of information in each memory cell. Such memory cells may be referred to as single-level cells (SLCs). Some types of memory cells are capable of storing two or more bits of information in each memory cell. Such memory cells are referred to herein as multiple-level cells, and may include, for example, memory cells capable of storing two bits, three bits, four bits, etc. Memory cells that store two bits are sometimes referred to as multi-level cells (MLCs), though this term is sometimes also used to refer to any memory cell that stores more than one bit. Memory cells that store three bits may be referred to as triple- or tri-level cells (TLCs), and memory cells that store four bits may be referred to as quad-level cells (QLCs), etc. A memory device with capable of storing more than a single bit may have an increased storage capacity when compared with a memory device with SLCs. In some cases, however, storing additional bits in a single memory cell may reduce the reliability of the data stored in the memory cell, as compared to storing a single bit. In such cases, a memory system may prioritize data reliability over storage capacity when using memory devices with memory cells capable of storing more than a single bit at one time.

In one example, a host device may increase a reliability of data identified for storage at the memory device by storing fewer bits in a single memory cell than the memory cell is capable of storing. For instance, the host device may generate a set of redundant data for storage with the data to be stored by the memory device. That is, the host device may transmit a write command including the identified data (e.g., a first set of data) and the generated data (e.g., a second set of data). The host device may identify a quantity of bits for storage at the memory device using a set of memory cells (e.g., memory cells capable of storing more than a single bit at one time) that is less than the quantity of bits the memory cells are capable of storing. Thus, the host device may generate a set of redundant bits for storage at the set of memory cells along with the identified data. Here, each memory cell of the set of memory cells may store at least one bit from the identified data and at least one bit from the generated data. In some cases, the host device may duplicate at least a portion of the identified data to generate the redundant data. The host device may additionally invert one or more bits of the generated data (e.g., based on a grey coding configuration of the memory device) prior to transmitting the write command. When performing a read operation, the host device may transmit a read command to the memory device and receive a set of data corresponding to the identified data and the generated data. The host device may validate at least a portion of the identified data using the generated data. Thus, the reliability of the identified data may be greater when compared to data stored by the memory device with no associated generated data.

In another example, the memory device may increase the reliability of data stored at the memory device by storing fewer bits in a single memory cell than the memory cell is capable of storing. When executing a write command indicating a first set of data to be stored at the memory device, the memory device may determine to operate in a first mode of operation (e.g., associated with increased reliability) instead of a second mode of operation (e.g., associated with increased storage capacity). Based on operating in the first mode of operation, the memory device may generate a set of redundant data corresponding to at least a portion of the data included in the write command. For example, the memory device may duplicate at least a portion of the data included in the write command. In some cases, the memory device may additionally invert one or more bits of the duplicated data (e.g., based on a grey coding configuration of the memory device). The memory device may then store, within a set of memory cells, both the data included in the write command and the data generated by the memory device. Here, each memory cell of the set of memory cells may be configured to store at least one bit from the data included in the write command and at least one bit from the data generated by the memory device.

When performing a read operation, the memory device may identify that the data indicated by a read command is associated with the first mode of operation. Thus, the memory device may elect to perform the read operation using a subset of a total quantity of reference thresholds for performing read operations. The memory device may retrieve a subset the data stored by the set of memory cells based on using the subset of reference thresholds. If the memory device detects an error within the subset of data, the memory device may perform an additional read operation using additional reference thresholds. The memory device may correct the detected errors within the subset of data based on retrieving additional data during the additional read operation. The memory device may then transmit the subset of data to the host device.

Features of the disclosure are initially described in the context of memory systems and devices as described with reference to FIGS. 1 and 2. Features of the disclosure are described in the context of distribution plots and memory systems as described with reference to FIGS. 3-7B. These and other features of the disclosure are further illustrated by and described with reference to apparatus diagrams and flowcharts that relate to enhanced data reliability in multi-level memory cells as described with reference to FIGS. 8-13.

FIG. 1 illustrates an example of a system 100 that supports enhanced data reliability in multi-level memory cells in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or a system on a chip (SoC), among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory array 170 may include, for example, DRAM memory cells, Flash-based memory cells (such as in a NAND memory die), FeRAM memory cells, or other types of memory cells.

A memory device 110 including two or more memory dies 160 may be referred to as a multi-die memory, a multi-die package, a multi-chip memory, or a multi-chip package. A memory device 110 that includes a device memory controller 155 and one or more memory dies 160, such as shown in FIG. 1, may be referred to as a managed memory device or managed memory package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may be operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Channels 115 may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, the CA channel 186 may include a read command with an address of the desired data. In some examples, a CA channel 186 may include any number of signal paths to decode one or more of address or command data (e.g., eight or nine signal paths).

In some examples, data channels 190 may be operable to communicate one or more of data or control information between the host device 105 and the memory device 110. For example, the data channels 190 may communicate information (e.g., bi-directional) to be written to the memory device 110 or information read from the memory device 110.

In some cases, the system 100 may operate to prioritize data reliability (e.g., stored at the memory device 110) over data capacity. For example, the host device 105 may increase a reliability of data identified for storage at the memory device 110 by storing fewer bits in each cell than the cell is capable of storing. To accomplish this, the host device 105 may generate a set of redundant data for storage at the memory device 110. The host device 105 may transmit a write command including the identified data (e.g., a first set of data) and the generated data (e.g., a second set of data) by channel 186 to the memory device 110. For example, the host device 105 may identify a quantity of bits for storage by a set of memory cells (e.g., memory cells capable of storing more than a single bit at one time) that is less than the quantity of bits the memory cells are configured to store. Thus, the host device 105 may generate a set of redundant bits for storage at the set of memory cells. Here, each memory cell of the set of memory cells may store at least one bit of the identified data and at least one bit of the generated data. In some cases, the host device 105 may duplicate at least a portion of the identified data to generate the redundant data. The host device 105 may additionally invert one or more bits of the generated data (e.g., based on a grey coding configuration of the memory device) prior to transmitting the write command. When performing a read operation, the host device 105 may transmit a read command to the memory device 110 and receive a set of data corresponding to the identified data and the generated data. The host device 105 may validate at least a portion of the identified data using the generated data. Thus, the reliability of the identified data may be greater when compared to data stored by the memory device 110 with no associated generated data.

In another example, the memory device 110 may increase the reliability of data stored at the memory device 110 by storing fewer bits in each cell than the cell is capable of storing. When executing a write command indicating a first set of data to be stored at the memory device 110, the memory device 110 may determine to operate in a first mode of operation (e.g., associated with increased reliability) instead of a second mode of operation (e.g., associated with increased storage capacity). Based on operating in the first mode of operation, the memory device 110 may generate a set of redundant data corresponding to at least a portion of the data included in the write command. For example, the memory device 110 may duplicate at least a portion of the data included in the write command. In some cases, the memory device 110 may additionally invert one or more bits of the duplicated data (e.g., based on a grey coding configuration of the memory device). The memory device 110 may then store, within a set of memory cells, both the data included in the write command and the data generated by the memory device 110. Here, each memory cell of the set of memory cells may be configured to store at least one bit from the data included in the write command and at least one bit from the data generated by the memory device 110.

When performing a read operation, the memory device 110 may identify that the data indicated by a read command is associated with data having a higher reliability. Thus, the memory device 110 may elect to perform the read operation using a subset of a total quantity of reference thresholds for performing read operations. The memory device 110 may retrieve a subset the data stored by the set of memory cells based on using the subset of reference thresholds. If the memory device 110 detects an error within the subset of data, the memory device 110 may perform an additional read operation using additional reference thresholds. The memory device 110 may correct the detected errors within the subset of data based on retrieving additional data during the additional read operation. The memory device 110 may then transmit the subset of data to the host device 105.

Figure 2:
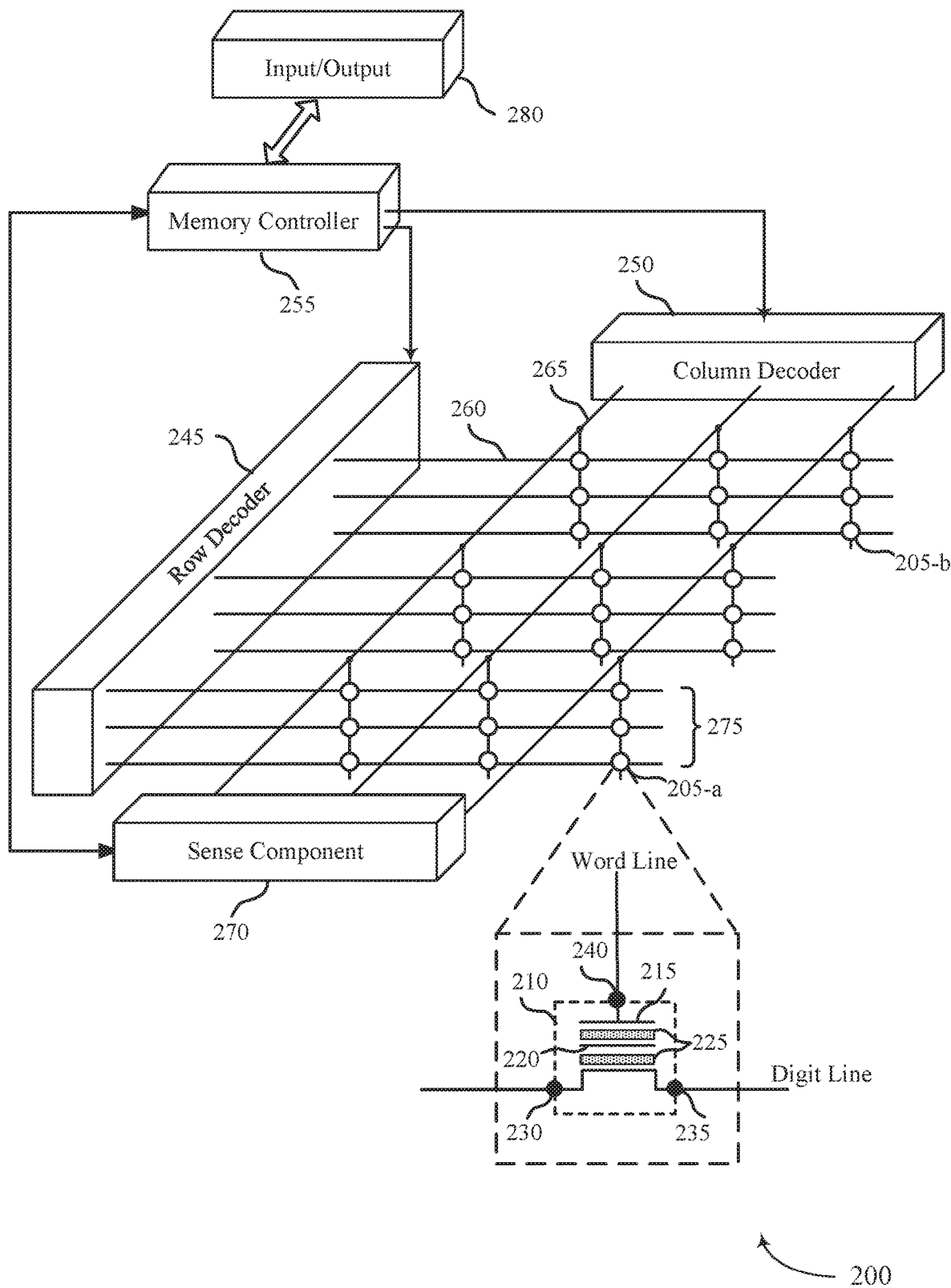
FIG. 2 illustrates an example of a memory device that supports enhanced data reliability in multi-level memory cells in accordance with examples as disclosed herein.

FIG. 2 illustrates an example of a memory device 200 that supports enhanced data reliability in multi-level memory cells in accordance with examples as disclosed herein. In some cases, the memory device 200 may be referred to as a managed memory device, a memory chip, or an electronic memory apparatus. The memory device 200 may include one or more memory cells, such as memory cell 205-a and memory cell 205-b (other memory ells are unlabeled). A memory cell 205 may be, for example, a Flash memory cell (such as depicted in the blow-up diagram of memory cell 205-a shown in FIG. 2), a DRAM memory cell, an FeRAM memory cell, a PCM memory cell, or another type of memory cell.

Each memory cell 205 may be programmed to store a logic state representing one or more bits of information. In some cases, a memory cell 205 may store one bit of information at a time (e.g., a logic state 0 or a logic state 1), such as in the memory cells of SLC memory blocks, which may be referred to as SLC memory cells. In some cases, a single memory cell 205 may store more than one bit of information at a time, such as in the memory cells of MLC, TLC, or QLC memory blocks. For example, a single memory cell 205 in an MLC memory block (e.g., an MLC memory cell) may be store two bits of information at a time by storing one of four logic states: logic state 00, logic state 01, logic state 10, or a logic state 11. For example, a single memory cell 205 in a TLC memory block (e.g., a TLC memory cell) may store three bits of information at a time by storing one of eight logic states: 000, 001, 010, 011, 100, 101, 110, 111.

A memory block associated with memory cells that store more than one bit of information at a time e.g., MLC, TLC, QLC memory blocks) may be configured to store data associated with multiple pages. For example, an MLC memory block may be configured to store data associated with two pages (e.g., a lower page and an upper page). That is, each memory cell within the MLC memory block may store a first bit (e.g., a lower bit) associated with a first page (e.g., the lower page) and a second bit (e.g., an upper bit) associated with a second page (e.g., the upper page). In another example, a QLC memory block may be configured to store data associated with four pages (e.g., a lower page, an upper page, an extra page, and a top page). Here, each memory cell within the QLC memory block may store a first bit (e.g., a lower hit) associated with a first page (e.g., the lower page), a second bit (e.g., an upper bit) associated with a second page (e.g., the upper page), a third bit (e.g., an extra bit) associated with a third page (e.g., the extra page), and a fourth bit (e.g., the top bit) associated with a fourth page (e.g., the top page).

In some cases, a multiple-level memory cell 205 (e.g., an MLC memory cell, TLC memory cell, or QLC memory cell) may be physically different than an SLC. For example, a multiple-level memory cell 205 may use a different cell geometry or be fabricated using different materials. In some cases, a multiple-level memory cell 205 may be physically the same or similar to an SLC, and other circuitry in a memory block (such as controller circuitry, sense amplifiers, drivers, etc.) may be configured to operate (e.g., read and write) the memory cell as an SLC, an MLC, a TLC, etc.

Different memory cell architectures may store a logic state in different ways. In FeRAM architectures, for example, each memory cell 205 may include a capacitor that includes a ferroelectric material to store a charge and/or a polarization representative of the programmable state. In DRAM architectures, each memory cell 205 may include a capacitor that includes a dielectric material (e.g., an insulator) to store a charge representative of the programmable state. In Flash memory architectures, each memory cell 205 may include a transistor that has a floating gate and/or a dielectric material for storing a charge representative of the logic state. For example, the blow-up diagram of memory cell 205-a in FIG. 2 is a Flash memory cell that includes a transistor 210 (e.g., a metal-oxide-semiconductor (MOS) transistor) that may be used to store a logic state. The transistor 210 has a control gate 215 and may include a floating gate 220 that is sandwiched between dielectric material 225. Transistor 210 includes a first node 230 (e.g., a source or drain) and a second node 235 (e.g., a drain or source). A logic state may be stored in transistor 210 by placing (e.g., writing, storing) a quantity of electrons (e.g., a charge) on floating gate 220. The amount of charge to be stored on the floating gate 220 may depend on the logic state to be stored. The charge stored on floating gate 220 may affect the threshold voltage of transistor 210, thereby affecting the amount of current that may flow through transistor 210 when transistor 210 is activated. The logic state stored in transistor 210 may be read by applying a voltage to the control gate 215 (e.g., at control node 240) to activate transistor 210 and measuring (e.g., detecting, sensing) the resulting amount of current that flows between the first node 230 and the second node 235.

For example, a sense component 270 may determine whether an SLC memory cell stores a logic state 0 or a logic state 1 in a binary manner (e.g., based on the presence or absence of a current from the memory cell 205, or based on whether the current is above or below a threshold current), For multiple-level cells, however, a sense component 270 may determine the logic state stored in the memory cell based on various intermediate levels of current. For example, a sense component 270 may determine the logic state of a TLC based on eight different levels of current (or ranges of current) that define the eight potential logic states that could be stored by the TLC. Such levels of current may be fairly closely spaced (in terms of magnitude), providing a lower margin for error than in the SLC case.

Additionally or alternatively, the sense component 270 may determine the logic state of a memory cell 205 based on whether current flows based on applying different reference thresholds (e.g., voltages) to the memory cell 205. For example, the sense component 270 may determine the logic state of a TLC based on applying seven different reference thresholds to the memory cell 205 and determining a presence or absence of a current from the memory cell associated with each reference threshold. In some cases, the sense component 270 may determine the logic state of a portion of the bits stored by the 205. For example, the memory cell 205 may be associated with a first mode of operation associated with high reliability (e.g., one or more bits stored by the memory cell 205 may be redundant). Here, the sense component 270 may apply a subset of the reference thresholds to the memory cell 205. For example, the sense component 270 may determine the logic state of a subset of the pages stored by the memory cell 205. That is, in the example that the memory cell 205 is a TLC, the sense component 270 may determine logic states of a first and second page while not determining the logic state of the third page. Here, the sense component 270 may apply three reference thresholds to the memory cell 205.

Similarly, a Flash SLC memory cell may be written by applying one of two voltages (e.g., a voltage above a threshold or a voltage below a threshold) to the memory cell to store (or not store) an electric charge on the floating gate representing one of the two possible logic states. In contrast, writing to a Flash multiple-level cell may use applying voltages at a finer level of granularity to more finely control the amount of charge stored on the floating gate, thereby enabling a larger set of logic states to be represented. Thus, multiple-level cells may be more sensitive to voltage or current variations that may occur in a memory device due to temperature variations or other operating conditions.

A charge-trapping Flash memory cell may operate in a manner similar to that of a floating-gate Flash memory cell, but instead of (or in addition to) storing a charge on a floating gate 220, a charge-trapping Flash memory cell may store a charge representing the state in a dielectric material below the control gate 215. Thus, a charge-trapping Flash memory cell may or may not include a floating gate 220.

In some examples, each row of memory cells 203 is connected to a word line 260 and each column of memory cells 203 is connected to a digit line 265. Thus, one memory cell 205 may be located at the intersection of a word line 260 and a digit line 265. This intersection may be referred to as a memory cars address. Digit lines are sometimes referred to as bit lines. In some cases, word lines 260 and digit lines 265 may be substantially perpendicular to one another and may create an array of memory cells 205, which may be an example of memory array 170 as described with reference to FIG. 1. In some cases, word lines 260 and digit lines 265 may be generically referred to as access lines or select lines.

In some cases, memory device 200 may include a three-dimensional (3D) memory array, where multiple two-dimensional (2D) memory arrays are formed on top of one another. This may increase the quantity of memory cells that may be placed or created on a single die or substrate as compared with 2D arrays, which in turn may reduce production costs, or increase the performance of the memory array, or both. In the example of FIG. 2, memory device 200 includes multiple levels of memory arrays. The levels may, in some examples, be separated by an electrically insulating material. Each level may be aligned or positioned so that memory cells 205 may be aligned (exactly, overlapping, or approximately) with one another across each level, forming memory cell stack 275. In some cases, memory cell stack 275 may be referred to as a string of memory cells, discussed in more detail with reference to FIG. 3.

Accessing memory cells 205 may be controlled through row decoder 245 and column decoder 250. For example, row decoder 245 may receive a row address from memory controller 255 and activate an appropriate word line 260 based on the received row address. Similarly, column decoder 250 may receive a column address from memory controller 255 and activate an appropriate digit line 265. Thus, by activating one word line 260 and one digit line 265, one memory cell 205 may be accessed.

Upon accessing, memory cell 205 may be read, or sensed, by sense component 270. For example, sense component 270 may be configured to determine the stored logic state of memory cell 205 based on a signal generated by accessing memory cell 205. The signal may include a voltage or electrical current, or both, and sense component 270 may include voltage sense amplifiers, current sense amplifiers, or both. For example, a current or voltage may be applied to a memory cell 205 (using the corresponding word line 260 and/or digit line 265) and the magnitude of the resulting current or voltage on the digit line 265 may depend on the logic state stored by the memory cell 205. For example, for a Flash memory cell, the amount of charge stored on a floating gate or in an insulating layer of a transistor in the memory cell 205 may affect the threshold voltage of the transistor, thereby affecting the amount of current that flows through the transistor in the memory cell 205 when the memory cell 205 is accessed. Such differences in current may be used to determine the logic state stored on the memory cell 205. Additionally, the presence or absence of the resulting current on the digit line 265 may depend on the logic state stored by the memory cell 205.

Sense component 270 may include various transistors or amplifiers in order to detect and amplify a signal (e.g., a current or voltage) on a digit line 265. The detected logic state of memory cell 205 may then be output via input/output block 280. In some cases, sense component 270 may be a part of column decoder 250 or row decoder 245, or sense component 270 may otherwise be connected to or in electronic communication with column decoder 250 or row decoder 245.

A memory cell 205 may be set or written by similarly activating the relevant word line 260 and digit line 265 to enable a logic state (e.g., representing one or more bits of information) to be stored in the memory cell 205. Column decoder 250 or row decoder 245 may accept data, for example from input/output block 280, to be written to the memory cells 205. As previously discussed, in the case of Flash memory (such as Flash memory used in NAND and 3D NAND memory devices) a memory cell 205 may be written by storing electrons in a floating gate or an insulating layer.

Memory controller 255 may control the operation (e.g., read, write, re-write, refresh) of memory cells 205 through the various components, for example, row decoder 245, column decoder 250, and sense component 270. In some cases, one or more of row decoder 245, column decoder 250, and sense component 270 may be co-located with memory controller 255. Memory controller 255 may generate row and column address signals in order to activate the desired word line 260 and digit line 265. Memory controller 255 may also generate and control various voltages or currents used during the operation of memory device 200.

In some cases, the memory controller 255 may determine to operate in a first mode of operation associated with a reliability above a threshold (e.g., instead of a second mode of operation associated with a storage capacity above a threshold). When executing a write command according to the first mode of operation, the memory controller 255 may generate a set of redundant data corresponding to at least a portion of the data included in the write command. For example, the memory controller 255 may duplicate at least a portion of the data included in the write command. In some cases, the memory controller 255 may additionally invert one or more bits of the duplicated data (e.g., based on a grey coding configuration of the memory device). The memory controller 255 may then store, within a set of memory cells 205, both the data included in the write command and the data generated by the memory controller 255. Here, each memory cell 205 of the set of memory cells 205 may be configured to store at least one bit from the data included in the write command and at least one bit from the data generated by the memory controller 255.

When performing a read operation, the memory controller 255 may identify that the data indicated by a read command is associated with the first mode of operation. Thus, the memory controller 255 may elect to perform the read operation using a subset of a total quantity of reference thresholds for performing read operations. In some cases, the memory controller 255 may indicate the subset of the reference thresholds to the sense component 270, The sense component 270 may sense a subset the data stored by the set of memory cells 205 based on using the subset of reference thresholds and output the sensed data (e.g., to the memory controller 255). If the memory controller 255 detects an error within the subset of data, the memory device 110 may indicate to the sense component 270 additional reference thresholds. The sense component 270 may sense the remaining data stored by the set of memory cells 205 using the additional reference thresholds. The memory controller 255 may correct the detected errors within the subset of data based on retrieving additional data during the additional sensing operation from the sense component 270.

Figure 3:
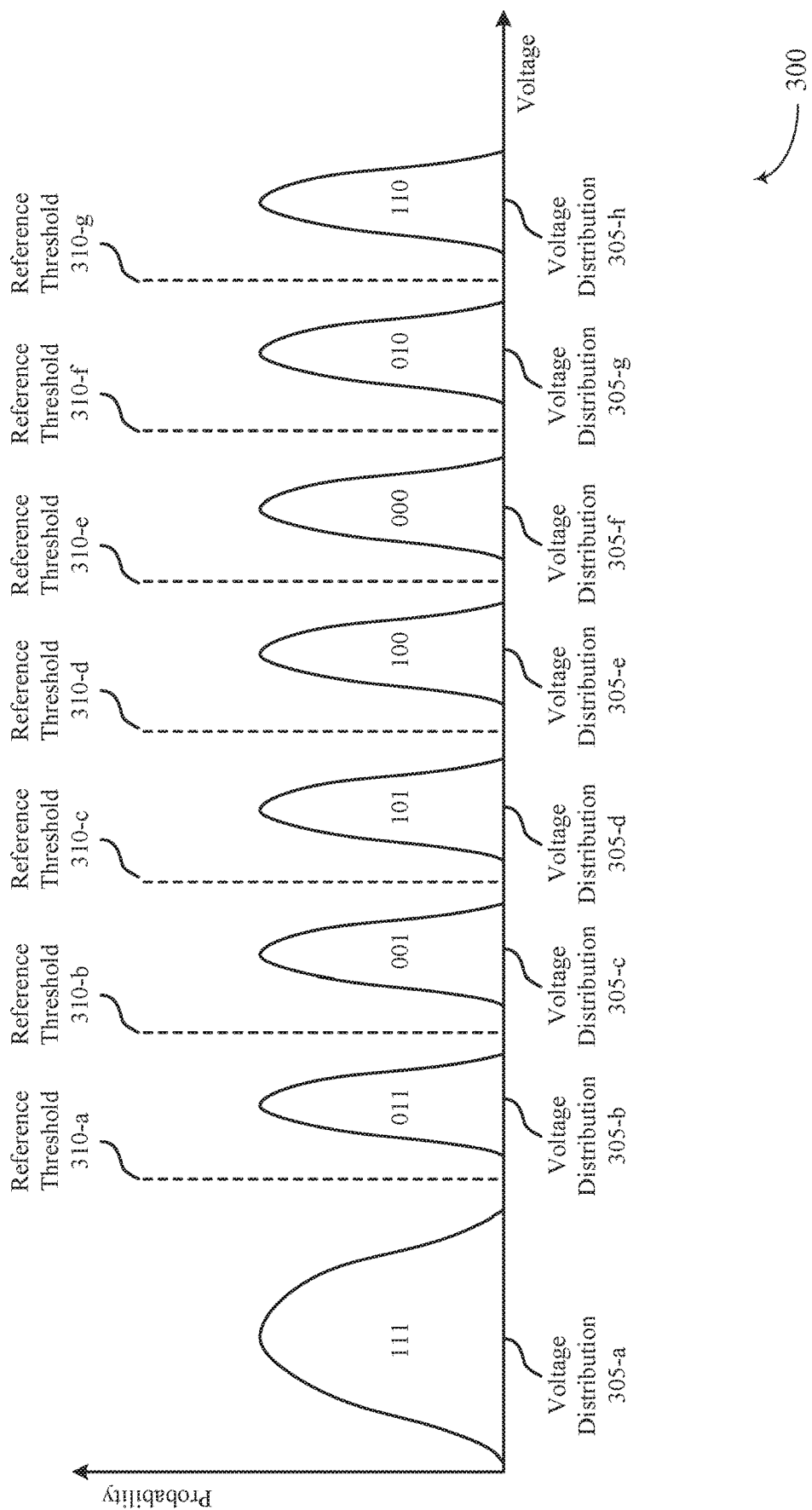
FIG. 3 illustrates an example of a distribution plot that supports enhanced data reliability in multi-level memory cells in accordance with examples as disclosed herein.

FIG. 3 illustrates an example of a distribution plot 300 that supports enhanced data reliability in multi-level memory cells in accordance with examples as disclosed herein. The distribution plot 300 may illustrate an example distribution plot 300 of a TLC as described herein. Although distribution plot 300 illustrates an example distribution plot 300 of a TLC, similar distribution plots 300 may apply for memory cells that store other quantities of bits. For example, an MLC or QLC may be associated with a similar distribution plot 300 with different quantities of voltage distributions 305 (e.g., based on a quantity of hits stored by the memory cell).

The distribution plot 300 may illustrate voltage distributions 305 associated with different logic states of a TLC. For example, the voltage distribution 305-a may illustrate the voltage distribution 305-a of a UC storing the logic value '111.' In another example, voltage distribution 305-d may illustrate the voltage distribution 305-d of a TLC storing the logic value '101.' In some cases, each logic state may correspond to data associated with more than one page of data. For example, the voltage distribution 305-a may be associated with the logic value '110.' The logic value '110' may include data associated with three pages (e.g., a lower page, an upper page, and an extra page). That is, the first bit '0' may be associated with a first page, the second bit 1' may be associated with a second page, and the third bit '1' may be associated with a third page.

The distribution plot 300 may also illustrate reference thresholds 310. The reference thresholds 310 may be examples of reference thresholds 310 as described with reference to FIG. 2. That is, a memory device may apply one or more reference thresholds 310 to one or more memory cells to determine the logic values stored by the one or more memory cells. For example, the memory device may apply each of the reference thresholds 310 to one or more memory cells to read each page of data stored by the one or more memory cells. In another example, the memory device may apply a subset of the reference thresholds 310 to the one or more memory cells to read a subset of the pages of data stored by the one or more memory cells. For example, the memory device may apply only reference threshold 310-d to determine a value stored by the memory cell associated with a first page the lower page). That is, if current flows from the memory cell after applying the reference threshold 310-d to the memory cell, the memory device may determine that the value stored by the memory cell associated with the first page is a logic value '0.' Alternatively, if current does not flow from the memory cell after applying the reference threshold 310-d to the memory cell, the memory device may determine that the value stored by the memory cell associated with the first page is a logic value '1.'

In another example, the memory device may apply three reference thresholds 310 to the memory cell to determine values stored by the memory cell associated with the first page (e.g., the lower page) and the second page (e.g., the upper page). For example, the memory device may apply either reference threshold 310-a or reference threshold 310-b; either reference threshold 310-c, reference threshold 310-d, or reference threshold 310-e; and either reference threshold 310-f or reference threshold 310-g.

In some cases, the memory device may determine to apply a subset of the reference thresholds 310 to the memory cell in a case that the memory cell is storing at least one bit of redundant data. For example, the memory device may receive data (e.g., within a write command) to be stored in the memory cell and generate the at least one bit of redundant data for storage in the memory cell based on operating in the first mode associated with a reliability greater than a threshold (e.g., as opposed to the second mode associated with a capacity greater than a threshold). In this example, the memory device may apply the subset of reference thresholds 310 to sense the data included in the write command. In cases that the memory device detects an error within the sensed data, the memory device may apply the remaining reference thresholds 310 to sense the redundant data. Here, the memory device may utilize the redundant data to correct the detected errors.

Figure 4:
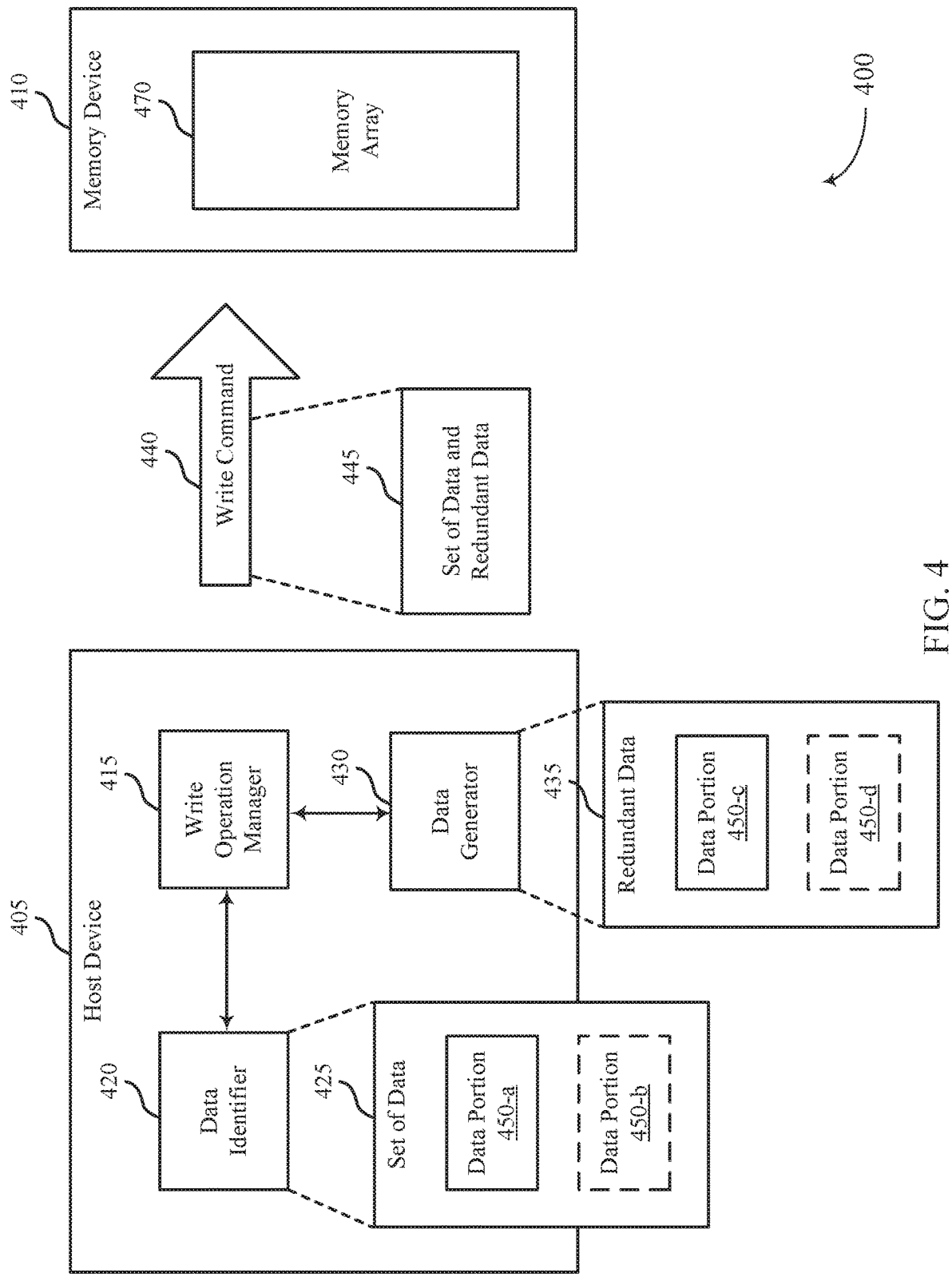
FIGS. 4 through 6 illustrate examples of systems that supports enhanced data reliability in multi-level memory cells in accordance with examples as disclosed herein.

FIG. 4 illustrates an example of a system 400 that supports enhanced data reliability in multi-level memory cells in accordance with examples as disclosed herein. The system 400 may include a host device 405 and memory device 410, which may be examples of host devices and memory devices as described with reference to FIGS. 1 through 3. System 400 may illustrate a host device 405 configured to transmit a high reliability write command 440 to the memory device 410.

The host device 405 may include a write operation manager 415, a data identifier 420, and a data generator 430. In some cases, the write operation manager 415, the data identifier 420, and the data generator 430 may be distinct components. Additionally, the write operation manager 415, the data identifier 420, and the data generator 430 may be integrated within a single component (e.g., an external memory controller or processor as described with reference to FIG. 1).

The host device 405 may determine to transmit a write command 440 to the memory device 410 to store the set of data 425 in the memory array 470 of the memory device 410. The data identifier 420 may additionally identify a set of memory cells within the memory array 470 to store the set of data 425. In some cases, the set of memory cells may each be capable of storing more than a single bit at one time. That is, the memory cells may be MLCs, TLCs, or QLCs. Here, each memory cell may be configured to store a bit of data associated with more than one page. That is, MLCs may be configured to store a first bit of data associated with a first page (e.g., a lower page) and a second bit of data associated with a second page (e.g., an upper page). In another example, TLCs may be configured to store a first bit of data associated with a first page (e.g., a lower page), a second bit of data associated with a second page (e.g., an upper page), and a third bit of data associated with a third page (e.g., an extra page). Additionally, QLCs may be configured to store four bits of data each associated with a first page, second page, third page, or fourth page.

The set of data 425 may include one or more data portions 450. Each data portion 450 may be associated with a different page. For example, the data portion 450-a may include data associated with the first page. Here, the write command may indicate that each memory cell of the set of memory cells stores one bit from the data portion 450-a. In some cases, the set of data 425 may optionally include additional data portions 450-b. For example, the set of data 425 may include the data portion 450-b associated with the second page. Here, the write command may indicate that each memory cell of the set of memory cells stores one bit from the data portion 450-a and one bit from the data portion 450-b.

In some cases, the host device 405 may determine to prioritize reliability of storing the data associated with the write command 440 (e.g., instead of data storage capacity). Thus, the host device 405 may identify a set of data 425 that a first quantity of bits that is less than a second quantity of bits that the set of memory cells are configured to store. For example, the set of memory cells may include ten memory cells and each memory cell within the set of memory cells may be configured to store four bits of data at one time. Here, the set of memory cells may be configured to store up to forty bits of data. In this example, the set of data 425 may include less than forty bits (e.g., thirty bits, twenty hits, ten bits). The set of data 425 may include a data portion 450 associated with less pages than each memory cell within the set of memory cells is associated with. For example, if the set of memory cells are QLCs, the set of data 425 may include one data portion 450, two data portions 450, or three data portions 450. In another example, if the set of memory cells are TLCs, the set of data 425 may include one data portion 450 or two data portions 450. Additionally, if the set of memory cells are MLCs, the set of data 425 may include one data portion 450-a.

The data identifier 420 may communicate the set of data 425 to the write operation manager 415. The write operation manager 415 may identify that the quantity of bits within the set of data is less than the quantity of bits that the set of memory cells within the memory array 470 are configured to store. Thus, the data generator 430 may generate the redundant data 435 such that a quantity of bits within the set of data 425 and the redundant data 435 is equal to the quantity of bits that the set of memory cells within the memory array 470 are configured to store. In one example, if the set of data 425 includes a single data portion 450-a and the set of memory cells includes ten TLCs (e.g., configured to store thirty bits), the data generator 430 may generate twenty bits of redundant data 435. In some cases, the data generator 430 may generate the redundant data by duplicating at least one of the data portions 450-a. For example, the data generator 430 may duplicate one of the data portions 450-a one or more times to generate one or more data portions 450 within the redundant data 435. Additionally or alternatively, the data generator 430 may duplicate more than one of the data portions 450 within the set of data 425 to generate the redundant data 435.

Each of the data portions 450 within the redundant data 435 may be associated with a different page than the data portions 450 within the set of data 425. In an example where the set of memory cells are MLCs, the set of data 425 may include a single data portion 450-a and the data generator 430 may duplicate the data portion 450-a to generate the data portion 450-c of the redundant data 435. In an example where the set of memory cells are TLCs, the set of data 425 may include one data portion 450-a associated with the first page. Here, the data generator 430 may duplicate the data portion 450-a twice: first to generate the data portion 450-c associated with the second page and the second time to generate the data portion 450-d associated with the third page. In another example where the set of memory cells are TLCs, the set of data 425 may include a first data portion 450-a associated with the first page and a second data portion 450-b associated with a second page. Here, the data generator 430 may duplicate either the data portion 450-a or the data portion 450-b to generate the data portion 450-c of the redundant data 435 associated with the third page.

In an example where the set of memory cells are QLCs, if the set of data 425 includes a single data portion 450-a, the data generator 430 may duplicate the data portion 450-a three times to generate three data portions 450 within the redundant data (e.g., where each of the data portions 450 within the redundant data 435 are associated with the second page, third page, or fourth page). If the set of data 425 includes two data portions 450-a and 450-b (e.g., associated with the first page and second page, respectively), the data generator 430 may duplicate one or both of the data portions 450 within the set of data 425 to generate the data portions 450-c and 450-d within the redundant data 435 (e.g., associated with the third and fourth pages, respectively). If the set of data 425 includes three data portions 450, the data generator 430 may duplicate one of the data portions 450 within the set of data 425 to generate one data portion 450-c within the redundant data 435 (e.g., associated with the fourth page).

The data generator 430 may additionally invert one or more bits of the duplicated data based on a grey coding configuration. That is, a grey coding may be implemented to avoid changing more than one bit (e.g., a least significant bit or a most significant bit) between consecutive physical levels of a signal, and may decrease an error rate of data transmitted via the signal, among other benefits. Thus, the data generator 430 may invert one or more bits of the duplicated data such that storing the set of data 425 and the redundant data 435 may increase (in some cases, maximize) the voltage difference between voltage distributions (e.g., as described with reference to FIG. 3) of possible logic values stored by each memory cell of the set of memory cells.

The data generator 430 may communicate the redundant data 435 to the write operation manager 415. The write operation manager 415 may generate the write command 440 including the set of data and the redundant data 445 and an indication of the set of memory cells. The write operation manager 415 may transmit the write command to the memory device 410. The memory device 410 may program the set of memory cells to store the set of data and the redundant data 445 based on receiving the write command 440. Because the write command includes the set of data and the redundant data 445, the reliability of the set of data 425 may be increased when compared to a write command 440 that includes the set of data 425 rather than the set of data and redundant data 445.

Figure 5:
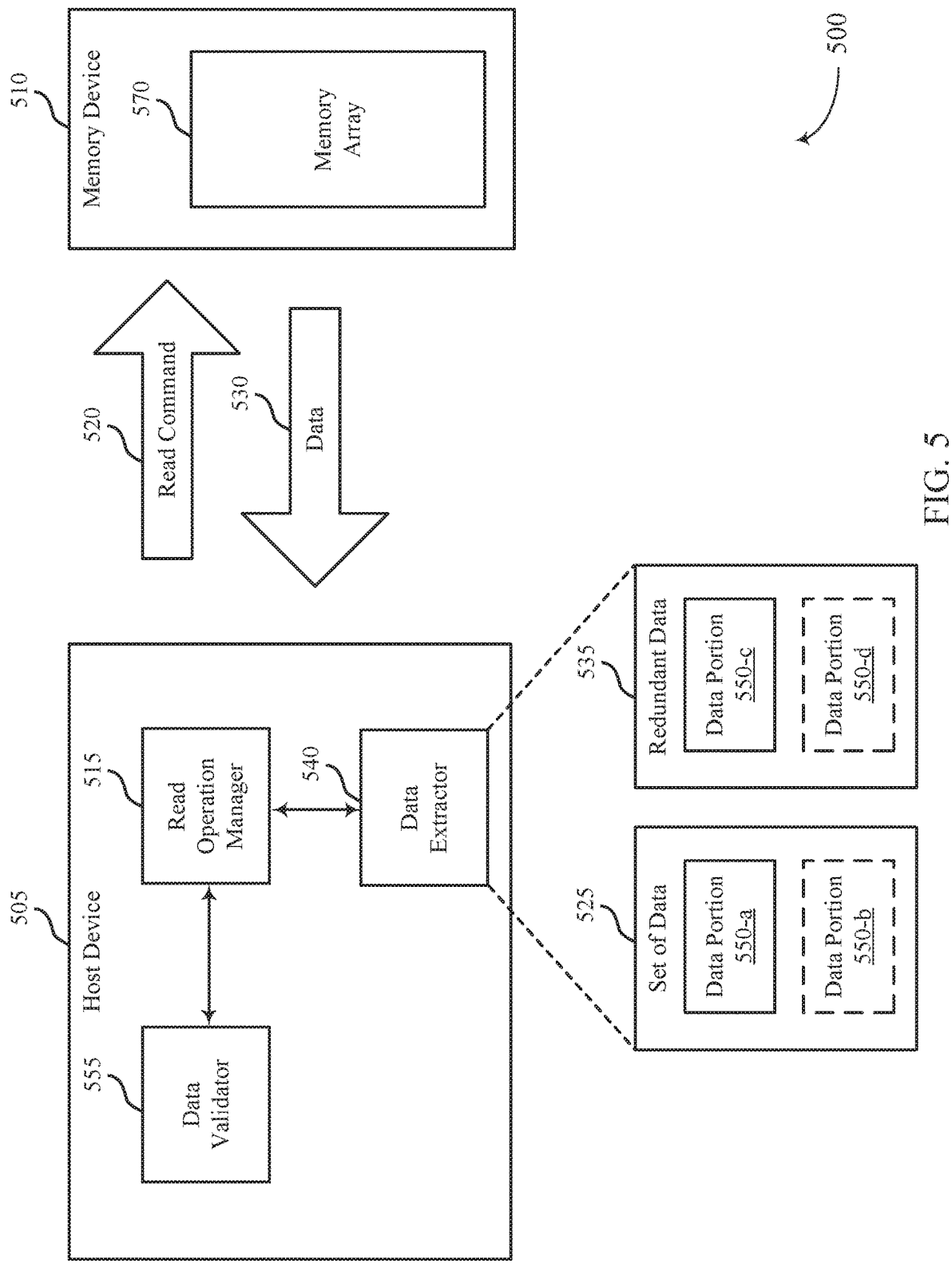

FIG. 5 illustrates an example of a system 5009 that supports enhanced data reliability in multi-level memory cells in accordance with examples as disclosed herein. The system 500 may include a host device 505 and a memory device 510, which may be examples of host devices and memory devices as described with reference to FIGS. 1 through 4. System 500 may illustrate components within a host device 505 configured to receive data from a memory device 510 programmed in response to a high reliability write command from the memory device 510 (e.g., as described with reference to FIG. 4). That is, FIG. 5 may illustrate a read operation performed on the set of memory cells programmed in response to the write command illustrated by FIG. 4.

The host device 505 may include a data validator 555, a read operation manager 515, and a data extractor 540. In some cases, the data validator 555, the read operation manager 515, and the data extractor 540 may be distinct components. Additionally, the data validator 555, the read operation manager 515, and the data extractor 540 may be integrated within a single component (e.g., an external memory controller or processor as described with reference to FIG. 1).

The host device 505 may determine to transmit a read command 520 to the memory device 510 to read the data 530 stored by a set of memory cells within the memory array 570 of the memory device 510. In some cases, the set of memory cells may each be capable of storing more than a single bit at one time. That is, the memory cells may be MLCs, TLCs, or QLCs. The read command 520 may indicate the set of memory cells to the memory device 510. The memory device 510 may perform a sensing operation on the set of memory cells to determine the data 530 stored by the set of memory cells. The memory device 510 may subsequently communicate the data 530 to the host device 505.

The read operation manager 515 at the host device 505 may receive the data 530 from the memory device 510 in response to transmitting the read command 520. The read operation manager 515 may communicate the data 530 to the data extractor 540. The data extractor 540 may extract the redundant data 535 from the data 530. That is, the data 530 may include the set of data 525 associated with a subset of pages and the redundant data 535 (e.g., as described with reference to FIG. 4) associated with a disjoint subset of pages. For example, data extractor 540 may identify that the set of memory cells are QLCs, the set of data 525 may include data associated with the first page and the second page while the redundant data 535 includes data associated with the third page and the fourth page. The set of data 525 may include one or more data portions 550. Each data portion 550 may be associated with a different page (e.g., of the set of memory cells of the memory array 570). For example, the data portion 550-a may include data associated with the first page and the data portion 550-b may be associated with the second page. Additionally, each of the data portions 550 within the redundant data 535 may be associated with a different page than the data portions 550 within the set of data 525.

In some cases, the data extractor 540 may additionally invert one or more bits to generate the redundant data 535. That is, when performing a write operation, a data generator at the host device (e.g., as described with reference to FIG. 5) may invert one or more bits of the duplicated data based on a grey coding configuration of the bits stored by the set of memory cells. Here, the data extractor 540 may invert the bits based on the same grey coding configuration to generate the redundant data 535.

The data extractor 540 may communicate the set of data 525 and the redundant data 535 to the read operation manager 515. The read operation manager 515 may communicate the set of data 525 and the redundant data 535 to the data validator 555. The data validator 555 may compare the redundant data 535 to at least a portion of the set of data 525 to validate the set of data 525. That is, each data portion 550 of the redundant data 535 should be the same as the data within one of the data portion 550 of the set of data 525. Thus, the data validator 55 may validate the set of data 525 if the data portions 550 within the redundant data 535 are the same as one of the data portions 550 within the set of data 525. Additionally, the data validator 555 may detect an error in a case that a data portion 550 within the redundant data 535 is different than a data portion 550 within the set of data 525. Here, the data validator 555 may perform an error correction procedure on the set of data 525 based on detecting an error to validate the set of data 525.

Figure 6:
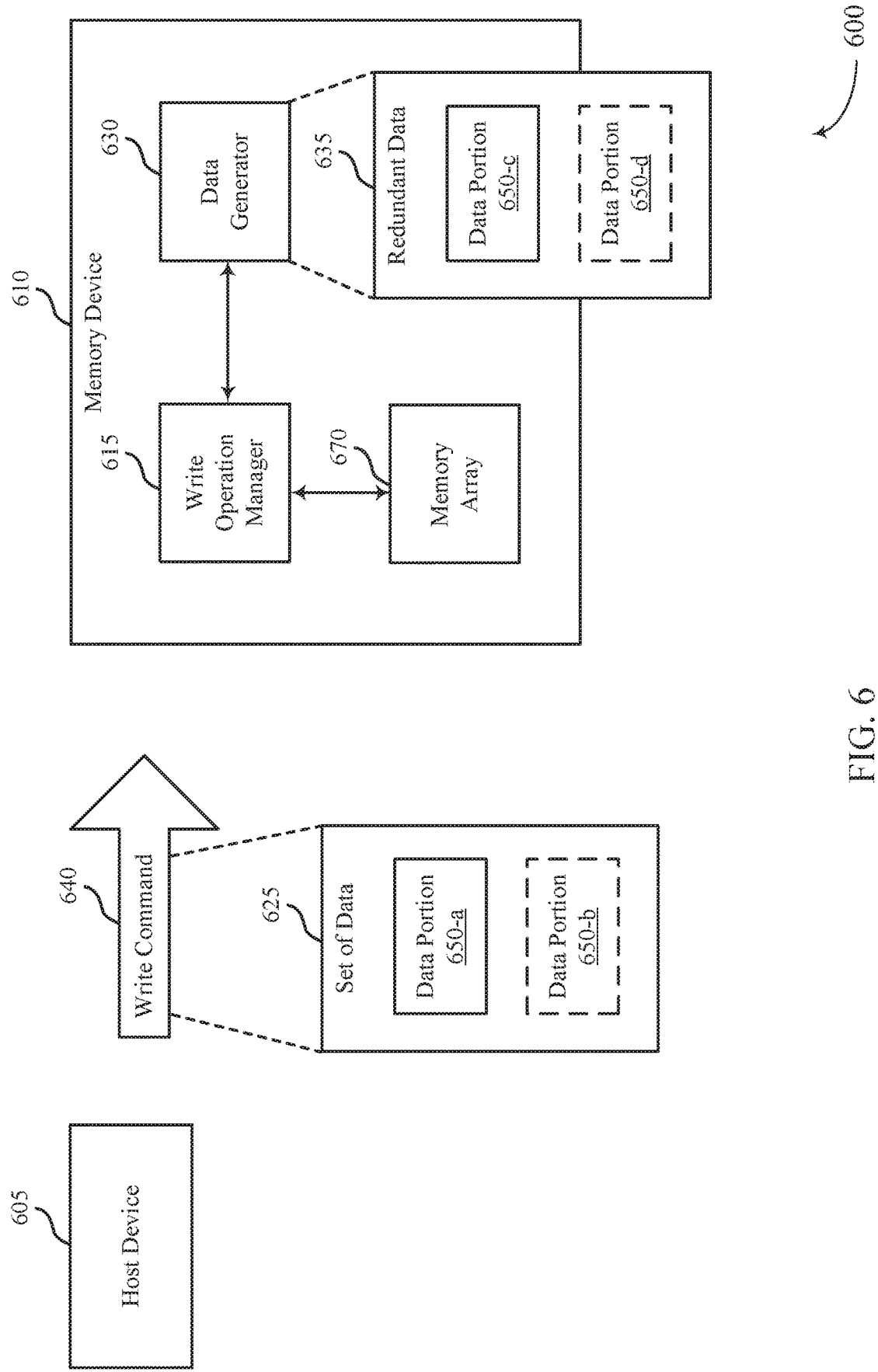

FIG. 6 illustrates an example of a system 600 that supports enhanced data reliability in multi-level memory cells in accordance with examples as disclosed herein. The system 600 may include a host device 605 and memory device 610, which may be examples of host devices and memory devices as described with reference to FIGS. 1 through 3. System 600 may illustrate a memory device 610 configured to perform a high reliability write operation based on receiving the write command 640 from the host device 605.

The memory device 610 may include a write operation manager 615, a data generator 630, and a memory array 670. In some cases, the write operation manager 615 and the data generator 630 may be distinct components. Additionally, the write operation manager 615 and the data generator 630 may be integrated within a single component (e.g., a memory controller such as a device memory controller or local memory controller as described with reference to FIGS. 1 and 2).

The host device 605 transmit a write command 640 to the memory device 610 to store the set of data 625 in the memory array 670 of the memory device 610. write command 640 may additionally identify a set of memory cells within the memory array 670 to store the set of data 625. In some cases, the set of memory cells may each be capable of storing more than a single bit at one time. That is, the memory cells may be MLCs, TLCs, or QLCs. Here, each memory cell may be configured to store a bit of data associated with more than one page. That is, MLCs may be configured to store a first bit of data associated with a first page (e.g., a lower page) and a second bit of data associated with a second page (e.g., an upper page). In another example, TLCs may be configured to store a first bit of data associated with a first page a lower page), a second bit of data associated with a second page (e.g., an upper page), and a third bit of data associated with a third page (e.g., an extra page). Additionally, QLCs may be configured to store four bits of data each associated with a first page, second page, third page, or fourth page.

The set of data 625 may include one or more data portions 650. Each data portion 650 may be associated with a different page. For example, the data portion 650-*a* may include data associated with the first page. Here, the write command may indicate that each memory cell of the set of memory cells stores one bit from the data portion 650-*a*. In some cases, the set of data 625 may optionally include additional data portions 650-*b*. For example, the set of data 625 may include the data portion 650-*b* associated with the second page. Here, the write command may indicate that each memory cell of the set of memory cells stores one bit from the data portion 650-*a* and one bit from the data portion 650-*b*.

The memory device 610 may receive the write command 640 and determine whether to operate in a first mode of operation or a second mode of operation for executing the write command 640. The first mode of operation may be associated with a reliability above a first threshold (e.g., a reliability threshold) and the second mode of operation may be associated with a storage capacity above a second threshold (e.g., a storage capacity threshold), The memory device 610 may determine which mode to operate in based on an indication within the write command 640. In one example, the host device 605 may include an opcode in the write command indicating the mode of operation. In another example, the memory device 610 may determine which mode to operate in based on the set of memory cells indicated by the write command 640. That is, the set of memory cells may be associated with either the first mode of operation or the second mode of operation. Here, the memory device 610 may determine to execute the write command 640 according to the first mode of operation (e.g., associated with higher reliability when compared to the second mode of operation).

Based on determining to execute the write command 640 according to the first mode of operation, the write operation manager 615 may communicate the set of data 625 to the data generator 630. The data generator 630 may generate the redundant data 635 (e.g., such that a quantity of bits within the set of data 625 and the redundant data 635 is equal to the quantity of bits that the set of memory cells within the memory array 670 are configured to store). Each of the data portions 650 within the redundant data 635 may be associated with a different page than the data portions 650 within the set of data 625. In an example where the set of memory cells are MLCs, the set of data 625 may include a single data portion 650-*a* and the data generator 630 may duplicate the data portion 650-*a* to generate the data portion 650-*c* of the redundant data 635. In an example where the set of memory cells are TLCs, the set of data 625 may include one data portion 650-*a* associated with the first page. Here, the data generator 630 may duplicate the data portion 650-*a* twice: first to generate the data portion 650-*c* associated with the second page and the second time to generate the data portion 650-*d* associated with the third page. In another example where the set of memory cells are TLCs, the set of data 625 may include a first data portion 650-*a* associated with the first page and a second data portion 650-*b* associated with a second page. Here, the data generator 630 may duplicate either the data portion 650-*a* or the data portion 650-*h* to generate the data portion 650-*c* of the redundant data 635 associated with the third page.

In an example where the set of memory cells are QLCs, if the set of data 625 includes a single data portion 650-*a*, the data generator 630 may duplicate the data portion 650-*a* three times to generate three data portions 650 within the redundant data (e.g., where each of the data portions 650 within the redundant data 635 are associated with the second page, third page, or fourth page). If the set of data 625 includes two data portions 650-*a* and 650-*b* (e.g., associated with the first page and second page, respectively), the data generator 630 may duplicate one or both of the data portions 650 within the set of data 625 to generate the data portions 650-*c* and 650-*d* within the redundant data 635 (e.g., associated with the third and fourth pages, respectively). If the set of data 625 includes three data portions 650, the data generator 630 may duplicate one of the data portions 650 within the set of data 625 to generate one data portion 650-*c* within the redundant data 635 (e.g., associated with the fourth page).

The data generator 630 may additionally invert one or more bits of the duplicated data based on a grey coding configuration. That is, a grey coding configuration may be implemented to avoid changing more than one bit (e.g., a least significant bit or a most significant bit) between consecutive physical levels of a signal, and may decrease an error rate of data transmitted via the signal, among other benefits. Here, the data generator 630 may invert one or more bits of the duplicated data such that storing the set of data and the redundant data 635 may increase (in some cases, maximize) the voltage difference between voltage distributions (e.g., as described with reference to FIG. 3) of possible logic values stored by each memory cell of the set of memory cells.

The data generator 630 may communicate the redundant data 635 to the write operation manager 615. The write operation manager 615 may program the set of memory cells within the memory array 670 to store the set of data 625 and the redundant data 635. Because the memory device 610 generated redundant data 635 and stored the redundant data 635 along with the set of data 625, the reliability of the set of data 625 may be increased when compared to an execution of the write command 640 where the memory device 610 programs the memory array 670 to store only the set of data 625.

Figure 7A:
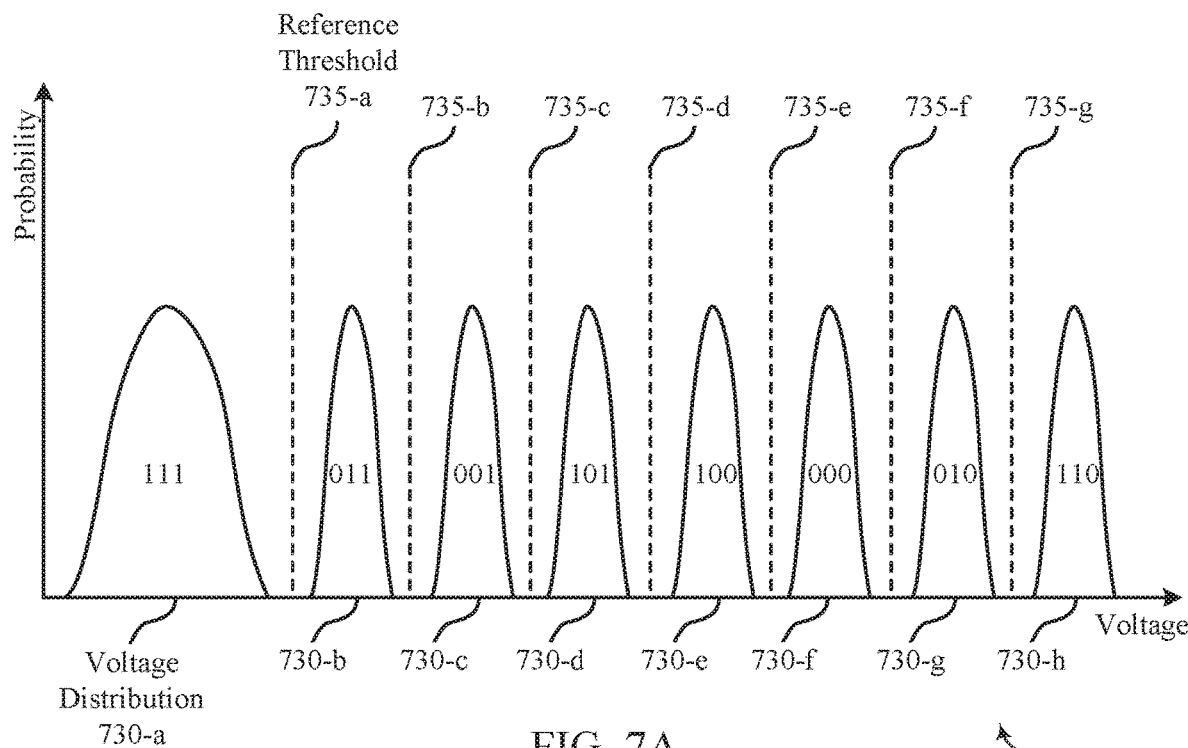
FIG. 7A illustrates an example of a distribution plot that supports enhanced data reliability in multi-level memory cells in accordance with examples as disclosed herein.
Figure 7B:
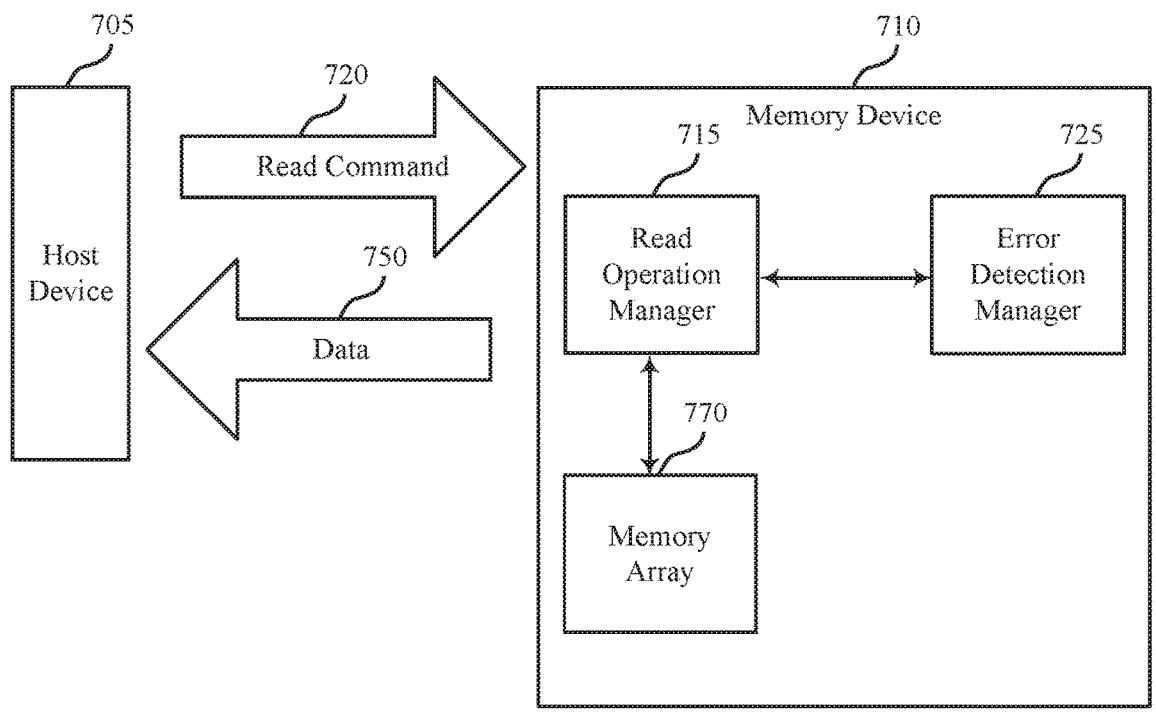
FIG. 7B illustrates an example of a system that supports enhanced data reliability in multi-level memory cells in accordance with examples as disclosed herein.

FIG. 7A illustrates an example of a distribution plot 700 that supports enhanced data reliability in multi-level memory cells in accordance with examples as disclosed herein. FIG. 7A illustrates a set of voltage distributions 730 and corresponding reference thresholds 735. Additionally, FIG. 7B illustrates an example of a system 701 that supports enhanced data reliability in multi-level memory cells in accordance with examples as disclosed herein. FIG. 7B illustrates a system 701 that utilizes a subset of the reference thresholds 735 to sense a subset of data stored in a memory array 770 at the memory device 710.

The distribution plot 700 may illustrate an example distribution plot 700 of a TLC as described herein. Although distribution plot 700 illustrates an example distribution plot 700 of a TLC, similar distribution plots 300 may apply for memory cells that store other quantities of bits. For example, an MLC or QLC may be associated with a similar distribution plot 700 with a different quantity of voltage distributions 730 (e.g., based on a quantity of bits stored by the memory cell). As described above with reference to FIG. 3, each voltage distribution 730 may be associated with a different logic state of a memory cell. Additionally, the memory device 710 may apply one or more reference thresholds 735 to one or more memory cells to determine at least a subset of the data stored by the one or more memory cells.

The memory device 710 may include a read operation manager 715 and an error detection manager 725. The read operation manager 715 and the error detection manager may be distinct components. Additionally, the read operation manager 715 and the error detection manager 725 may be integrated within a single component (e.g., a memory controller such as a device memory controller or local memory controller as described with reference to FIGS. 1 and 2).

The host device 705 transmit a read command 720 to the memory device 710 to read the data 750 stored by a set of memory cells within the memory array 770 of the memory device 710. For example, the read command 720 may indicate the set of memory cells to the memory device 710. In some cases, the set of memory cells may each be capable of storing more than a single bit at one time. That is, the memory cells may be MLCs, TLCs, or QLCs.

The memory device 710 may receive the read command 720 and determine whether to operate in a first mode of operation or a second mode of operation for executing the read command 740. The first mode of operation may be associated with a reliability above a first threshold (e.g., a reliability threshold) and the second mode of operation may be associated with a storage capacity above a second threshold (e.g., a storage capacity threshold). The memory device 710 may determine which mode to operate in based on an indication within the read command 720. In one example, the host device 705 may include an opcode in the read command indicating the mode of operation. In another example, the memory device 710 may determine which mode to operate in based on the set of memory cells indicated by the read command 720. That is, the set of memory cells may be associated with either the first mode of operation or the second mode of operation. Here, the memory device 710 may determine to execute the read command 740 according to the first mode of operation (e.g., associated with higher reliability when compared to the second mode of operation).

Based on selecting the first mode of operation, the read operation manager 715 may select one or more reference thresholds 735 for executing the read command 720. For example, the read operation manager 715 may select a subset of the reference thresholds 735. The read operation manager 715 may perform a sensing operation on the set of memory cells within the memory array 770 using the subset of reference thresholds 735. The read operation manager 715 may subsequently retrieve a subset of the data stored by the set of memory cells within the memory array 770 based on using the subset of reference thresholds. For example, the read operation manager 715 may determine to apply a single reference threshold 735 to read one page of data from the set of memory cells. That is, if the read operation manager 715 applies the reference threshold 735-d to the set of memory cells, the read operation manager 715 may retrieve a first page of data from the set of memory cells. In another example, the read operation manager 715 may determine to apply three reference thresholds 735 to the set of memory cells to retrieve two pages of data from the set of memory cells (e.g., the first and second pages of data). That is, the read operation manager 715 may apply reference threshold 735-a, 735-d, and 735-g to retrieve the first and second pages of data from the set of memory cells of the memory array 770.

The read operation manager 715 may communicate the retrieved data (e.g., a first set of data) to the error detection manager 725. The error detection manager 725 may perform an error detection operation to detect potential errors within the first set of retrieved data (e.g., based on a cyclic redundancy check (CRC), based on a low-density parity check (LPDC)). In some cases, the error detection manager 725 may correct one or more detected errors. In a case that no errors are detected (or any detected errors are corrected), the read operation manager 715 may communicate the first set of data 750 (e.g., a subset of the data stored by the set of memory cells in the memory array 770) to the host device 705 in response to the read command 720. Additionally, if the error detection manager 725 detects an error within the first set of retrieved data (e.g., and is unable to correct the detected error), the read operation manager 715 may select one or more additional reference thresholds 735 to retrieve additional data from the memory array 770. For example, the read operation manager 715 may select the remaining reference thresholds 735 to retrieve some or all of the data stored by the set of memory cells.

The read operation manager 715 may retrieve additional data from the set of memory cells based on selecting the one or more additional reference thresholds 735. The additional data (e.g., a second set of data) may include one or more portions of redundant data (e.g., as described with reference to FIG. 6). That is, the first set of data may include one or more data portions each associated with a different page and the second set of data may include one or more data portions each associated with a different page than the data portions within the first set of data. The read operation manager 715 may, in some cases, invert one or more bits within the second set of data to generate the redundant data. That is, when performing a write operation, the memory device 710 may invert one or more bits of the duplicated data based on a grey coding configuration of the bits stored by the set of memory cells. Here, the read operation manager 715 may invert the bits based on the same grey coding configuration to generate the redundant data.

The read operation manager 715 may communicate the redundant data to the error detection manager 725. In some cases, the error detection manager 725 may perform an error detection operation on the redundant to detect potential errors within the first set of retrieved data (e.g., based on a CRC, based on an LPDC). In some cases, the error detection manager 725 may correct one or more detected errors. In a case that no errors are detected (or any detected errors are corrected), the read operation manager 715 may communicate the redundant data to the host device 705 in response to the read command 720. Additionally or alternatively, the error detection manager 725 may compare the redundant data to the first set of data. In some cases, the error detection manager 725 may correct a detected error (e.g., invert one or more bits within the first set of data) based on comparing the redundant data to the first set of data. That is, the error detection manager 725 may identify a difference between the redundant data and the first set of data and invert one or more bits of the first set of data based on the identified difference.

The error detection manager 725 may communicate the corrected first set of data to the read operation manager 715. The read operation manager 715 may communicate the corrected first set of data 750 to the host device 705 in response to the read command 720.

Figure 8:
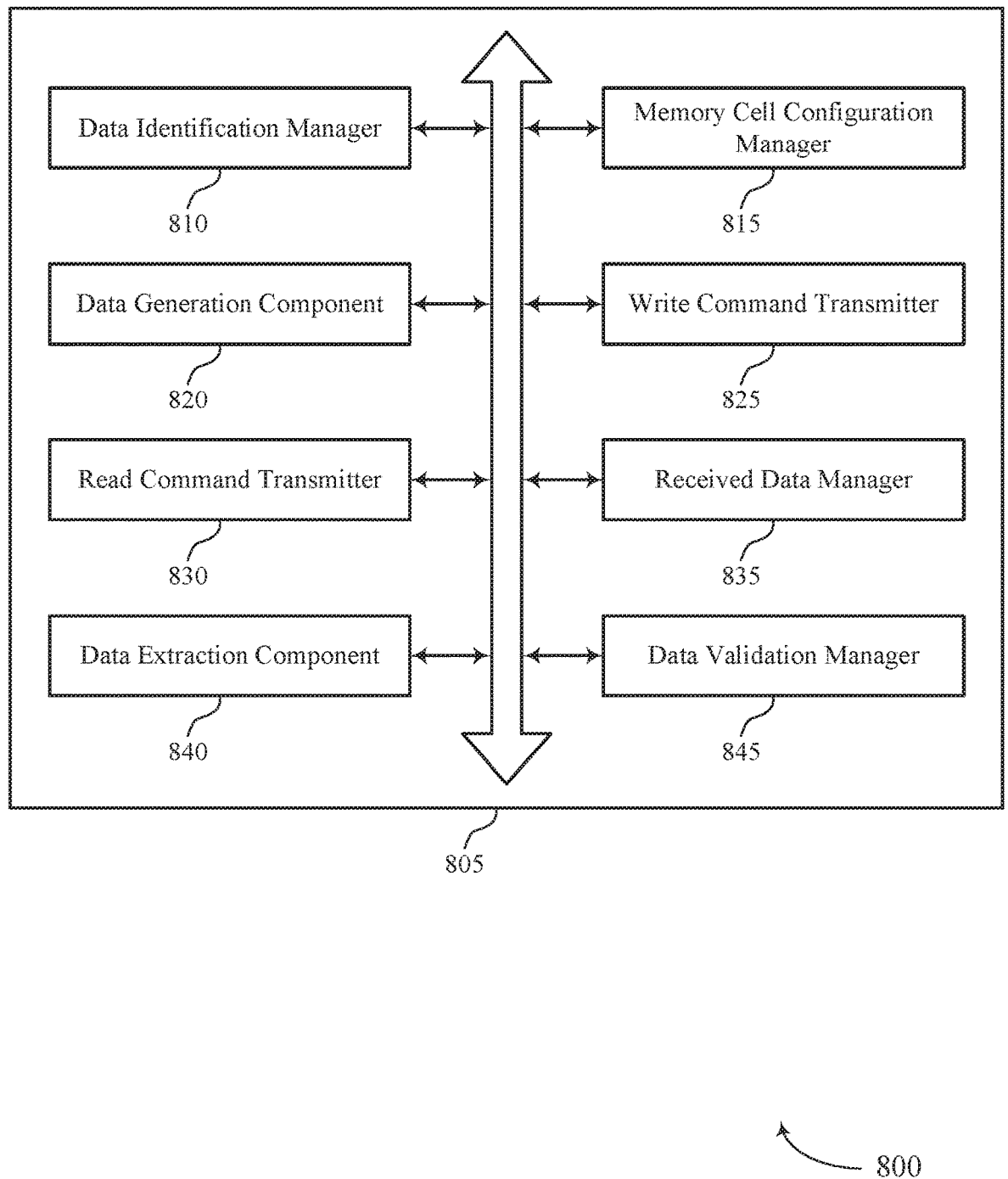
FIG. 8 shows a block diagram of a host device that supports enhanced data reliability in multi-level memory cells in accordance with examples as disclosed herein.

FIG. 8 shows a block diagram 800 of a host device 805 that supports enhanced data reliability in multi-level memory cells in accordance with examples as disclosed herein. The host device 805 may be an example of aspects of a host device as described with reference to FIG. 1, FIG. 3, and FIG. 4. The host device 805 may include a data identification manager 810, a memory cell configuration manager 815, a data generation component 820, a write command transmitter 825, a read command transmitter 830, a received data manager 835, a data extraction component 840, and a data validation manager 845. Each of these components may communicate, directly or indirectly, with one another (e.g., via one or more buses).

The data identification manager 810 may identify a first set of data to store in a memory device using one or more memory cells that are each configured to store a first quantity of bits. In some cases, the first set of data and the second set of data are configured to cause the first quantity of bits to be stored in each memory cell.

The memory cell configuration manager 815 may identify that the first set of data is configured to cause each memory cell associated with the first set of data to store a second quantity of bits that is less than the first quantity of bits based on identifying the first set of data. In some cases, each of the one or more memory cells are configured to store data associated with a set of pages. In some instances, each bit of the first quantity of bits is associated with one page of the set of pages.

The data generation component 820 may generate a second set of data for storing with the first set of data in the memory device based on identifying that the first set of data is configured to cause each memory cell associated with the first set of data to store the second quantity of bits in each memory cell that is less than the first quantity of bits. In some examples, the data generation component 820 may duplicate a portion of the first set of data, where generating the second set of data is based on duplicating the portion of the first set of data. In some cases, the data generation component 820 may invert one or more bits of the duplicated portion of the first set of data to generate one or more bits of the second set of data based on a grey coding configuration of the first quantity of bits capable of being stored in each memory cell. In some instances, the first set of data is associated with one or more pages of the set of pages. In some examples, the second set of data is associated with at least one page of the set of pages that is different than the one or more pages associated with the first set of data.

In some instances, the data generation component 820 may duplicate each bit of the first set of data that is associated with a first page of a set of pages to generate a first portion of the second set of data that is associated with a second page of the set of pages, where the second page is different from the first page. In some examples, the data generation component 820 may duplicate each bit of the first set of data associated with a third page of the set of pages to generate a second portion of the second set of data associated with a fourth page of the set of pages, where the third page is different from the first page, the second page, and the fourth page. In some cases, the data generation component 820 may duplicate each bit of the first set of data associated with the first page of the set of pages to generate a second portion of the second set of data associated with a third page of the set of pages, where the third page is different from the first page and the second page.

The write command transmitter 825 may transmit, to the memory device, a write command that includes the first set of data and the second set of data.

The read command transmitter 830 may transmit, to a memory device, a read command to retrieve a first set of data from stored in the memory device using one or more memory cells that are each configured to store a first quantity of bits. In some cases, each of the one or more memory cells are configured to store data associated with a set of pages. In some instances, each bit of the first set of data is associated with one page of the set of pages.

The received data manager 835 may receive, from the memory device, the first set of data based on transmitting the read command.

The data extraction component 840 may extract a second set of data from the first set of data, the second set of data including a second quantity of hits associated with each memory cell that is less than the first quantity of bits included in the first set of data. In some examples, the data extraction component 840 may identify a first subset of the set of pages associated with the first portion of the first set of data. In some cases, the data extraction component 840 may identify a second subset of the set of pages disjoint from the first subset of the set of pages that is associated with the second set of data, where extracting the second set of data from the first set of data is based on identifying the first subset and the second subset.

The data validation manager 845 may validate, using the second set of data, a first portion of the first set of data that remains after the second set of data was extracted. In some examples, the data validation manager 845 may identify that the second set of data is the same as the first portion of the first set of data that remained after the second set of data was extracted from the first set of data, where validating the first portion is based on identifying the second set of data is the same as the first portion. In some cases, the data validation manager 845 may invert one or more bits of the second set of data based on a grey coding configuration of the first quantity of bits capable of being stored in each memory cell, where validating the first portion of the first set of data is based on inverting one or more bits of the second set of data. In some examples, at least a portion of the first portion of the first set of data is the same as the inverted one or more bits of the second set of data.

In some instances, the data validation manager 845 may compare the first portion of the first set of data to the second set of data, where validating the first portion of the first set of data using the second set of data is based on the comparing. In some examples, the data validation manager 845 may identify a difference between the first portion of the first set of data and the second set of data. In some cases, the data validation manager 845 may perform an error correction procedure on the first portion of the first set of data based on identifying the difference, where validating the first portion of the first set of data is based on performing the error correction procedure.

Figure 9:
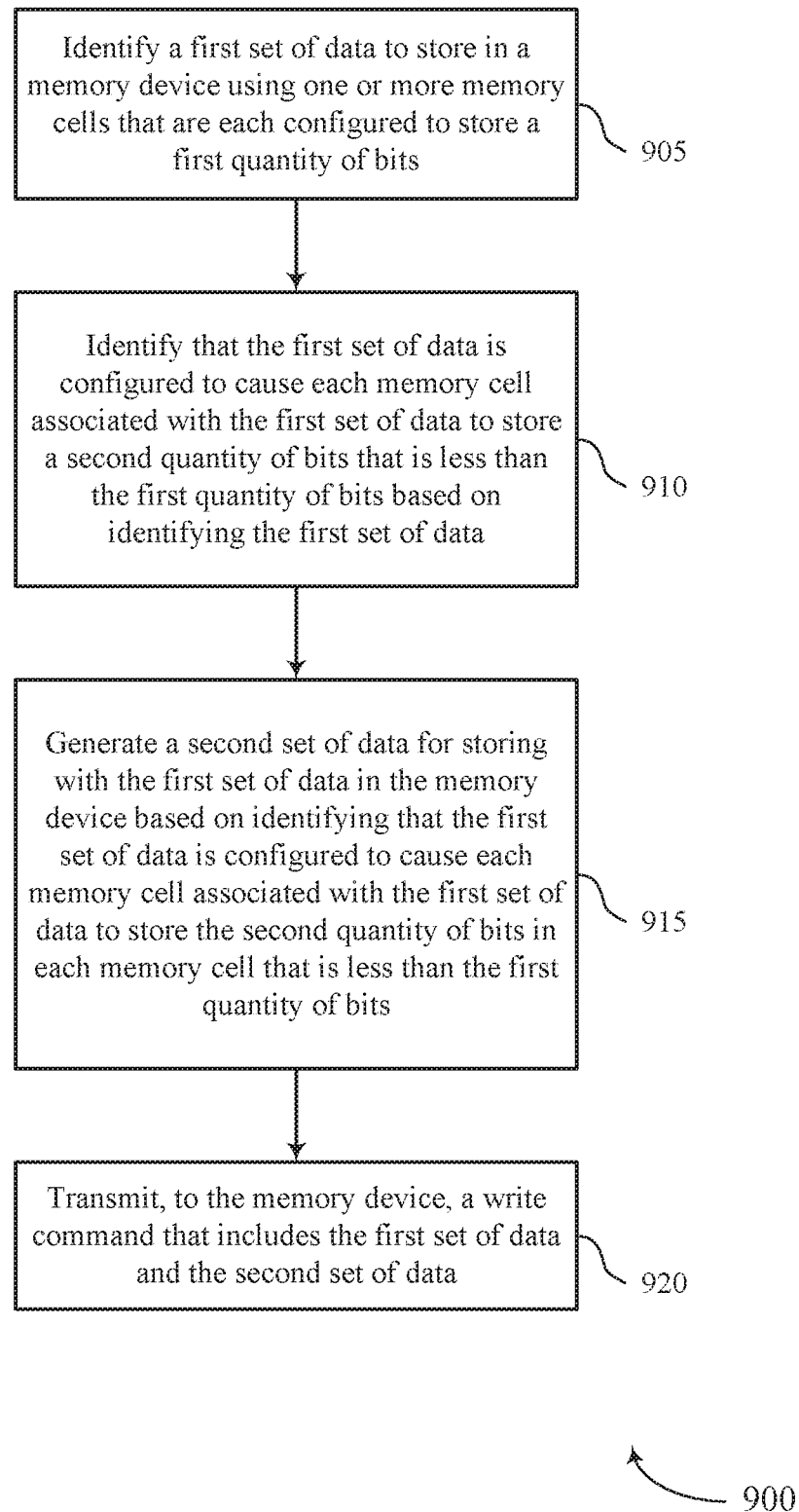
FIGS. 9 and 10 show flowcharts illustrating a method or methods that support enhanced data reliability in multi-level memory cells in accordance with examples as disclosed herein.

FIG. 9 shows a flowchart illustrating a method or methods 900 that supports enhanced data reliability in multi-level memory cells in accordance with examples as disclosed herein. The operations of method 900 may be implemented by a host device or its components as described herein. For example, the operations of method 900 may be performed by a host device as described with reference to FIG. 8. In some examples, a host device may execute a set of instructions to control the functional elements of the host device to perform the described functions. Additionally or alternatively, a host device may perform aspects of the described functions using special-purpose hardware.

At 905, the host device may identify a first set of data to store in a memory device using one or more memory cells that are each configured to store a first quantity of bits. The operations of 905 may be performed according to the methods described herein. In some examples, aspects of the operations of 905 may be performed by a data identification manager as described with reference to FIG. 8.

At 910, the host device may identify that the first set of data is configured to cause each memory cell associated with the first set of data to store a second quantity of bits that is less than the first quantity of bits based on identifying the first set of data. The operations of 910 may be performed according to the methods described herein. In some examples, aspects of the operations of 910 may be performed by a memory cell configuration manager as described with reference to FIG. 8.

At 915, the host device may generate a second set of data for storing with the first set of data in the memory device based on identifying that the first set of data is configured to cause each memory cell associated with the first set of data to store the second quantity of bits in each memory cell that is less than the first quantity of bits. The operations of 915 may be performed according to the methods described herein. In some examples, aspects of the operations of 915 may be performed by a data generation component as described with reference to FIG. 8.

At 920, the host device may transmit, to the memory device, a write command that includes the first set of data and the second set of data. The operations of 920 may be performed according to the methods described herein. In some examples, aspects of the operations of 920 may be performed by a write command transmitter as described with reference to FIG. 8.

In some examples, an apparatus as described herein may perform a method or methods, such as the method 900. The apparatus may include features, means, or instructions (e.g., a non-transitory computer-readable medium storing instructions executable by a processor) for identifying a first set of data to store in a memory device using one or more memory cells that are each configured to store a first quantity of bits, identifying that the first set of data is configured to cause each memory cell associated with the first set of data to store a second quantity of bits that is less than the first quantity of bits based on identifying the first set of data, generating a second set of data for storing with the first set of data in the memory device based on identifying that the first set of data is configured to cause each memory cell associated with the first set of data to store the second quantity of bits in each memory cell that is less than the first quantity of bits, and transmitting, to the memory device, a write command that includes the first set of data and the second set of data.

In some cases of the method 900 and the apparatus described herein, the first set of data and the second set of data may be configured to cause the first quantity of bits to be stored in each memory cell.

Some instances of the method 900 and the apparatus described herein may further include operations, features, means, or instructions for duplicating a portion of the first set of data, where generating the second set of data may be based on duplicating the portion of the first set of data.

Some examples of the method 900 and the apparatus described herein may further include operations, features, means, or instructions for inverting one or more bits of the duplicated portion of the first set of data to generate one or more bits of the second set of data based on a grey coding configuration of the first quantity of bits capable of being stored in each memory cell.

In some cases of the method 900 and the apparatus described herein, each of the one or more memory cells may be configured to store data associated with a set of pages, and each bit of the first quantity of bits may be associated with one page of the set of pages.

In some instances of the method 900 and the apparatus described herein, the first set of data may be associated with one or more pages of the set of pages, and the second set of data may be associated with at least one page of the set of pages that may be different than the one or more pages associated with the first set of data.

Some examples of the method 900 and the apparatus described herein may further include operations, features, means, or instructions for duplicating each bit of the first set of data that may be associated with a first page of a set of pages to generate a first portion of the second set of data that may be associated with a second page of the set of pages, where the second page may be different from the first page.

Some cases of the method 900 and the apparatus described herein may further include operations, features, means, or instructions for duplicating each bit of the first set of data associated with a third page of the set of pages to generate a second portion of the second set of data associated with a fourth page of the set of pages, where the third page may be different from the first page, the second page, and the fourth page.

Some instances of the method 900 and the apparatus described herein may further include operations, features, means, or instructions for duplicating each bit of the first set of data associated with the first page of the set of pages to generate a second portion of the second set of data associated with a third page of the set of pages, where the third page may be different from the first page and the second page.

Figure 10:
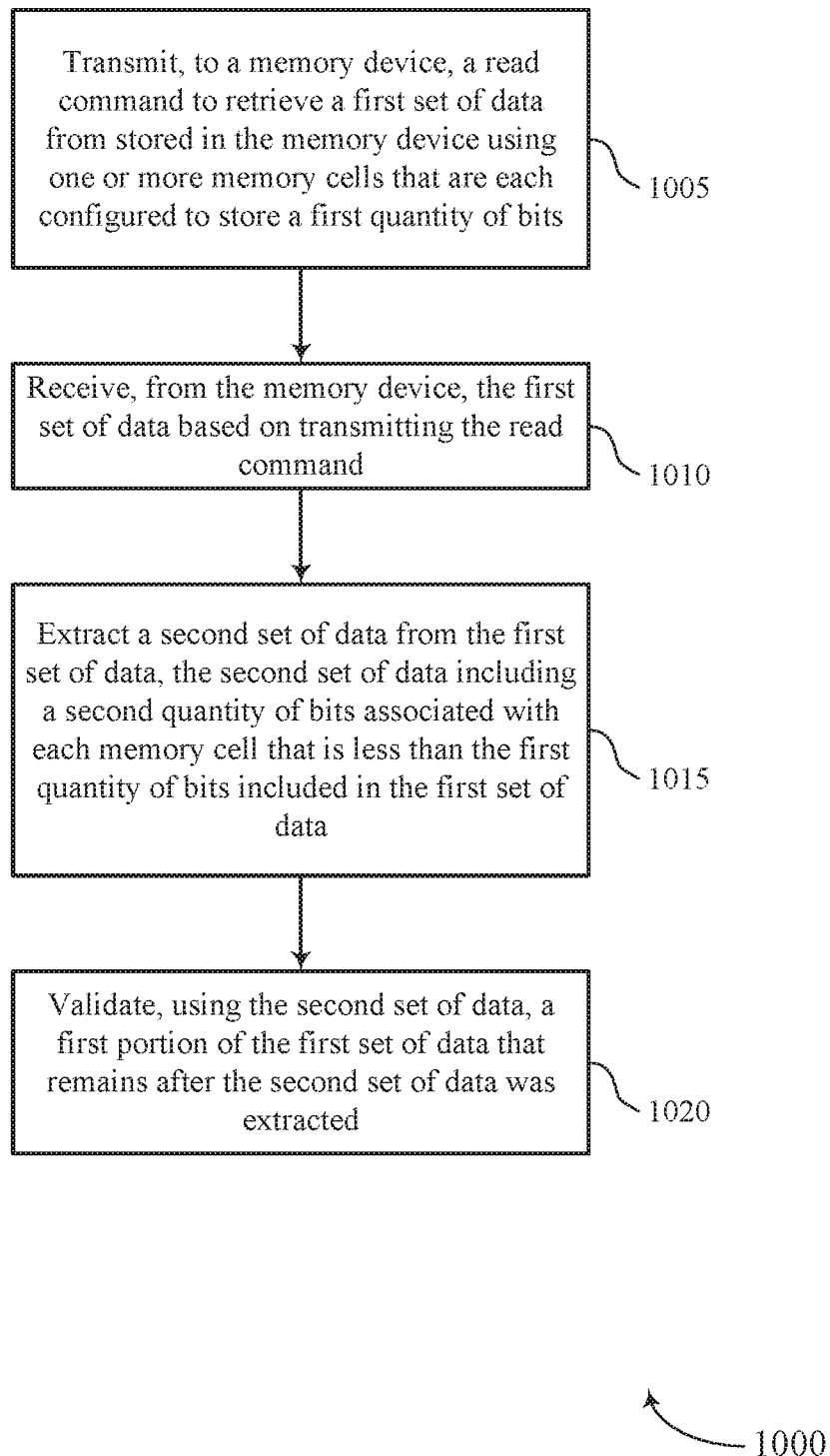

FIG. 10 shows a flowchart illustrating a method or methods 1000 that supports enhanced data reliability in multi-level memory cells in accordance with examples as disclosed herein. The operations of method 1000 may be implemented by a host device or its components as described herein. For example, the operations of method 1000 may be performed by a host device as described with reference to FIG. 8. In some examples, a host device may execute a set of instructions to control the functional elements of the host device to perform the described functions. Additionally or alternatively, a host device may perform aspects of the described functions using special-purpose hardware.

At 1005, the host device may transmit, to a memory device, a read command to retrieve a first set of data from stored in the memory device using one or more memory cells that are each configured to store a first quantity of bits.

The operations of 1005 may be performed according to the methods described herein. In some examples, aspects of the operations of 1005 may be performed by a read command transmitter as described with reference to FIG. 8.

At 1010, the host device may receive, from the memory device, the first set of data based on transmitting the read command. The operations of 1010 may be performed according to the methods described herein. In some examples, aspects of the operations of 1010 may be performed by a received data manager as described with reference to FIG. 8.

At 1015, the host device may extract a second set of data from the first set of data, the second set of data including a second quantity of bits associated with each memory cell that is less than the first quantity of bits included in the first set of data. The operations of 1015 may be performed according to the methods described herein. In some examples, aspects of the operations of 1015 may be performed by a data extraction component as described with reference to FIG. 8.

At 1020, the host device may validate, using the second set of data, a first portion of the first set of data that remains after the second set of data was extracted. The operations of 1020 may be performed according to the methods described herein. In some examples, aspects of the operations of 1020 may be performed by a data validation manager as described with reference to FIG. 8.

In some examples, an apparatus as described herein may perform a method or methods, such as the method 1000. The apparatus may include features, means, or instructions (e.g., a non-transitory computer-readable medium storing instructions executable by a processor) for transmitting, to a memory device, a read command to retrieve a first set of data from stored in the memory device using one or more memory cells that are each configured to store a first quantity of bits, receiving, from the memory device, the first set of data based on transmitting the read command, extracting a second set of data from the first set of data, the second set of data including a second quantity of bits associated with each memory cell that is less than the first quantity of bits included in the first set of data, and validating, using the second set of data, a first portion of the first set of data that remains after the second set of data was extracted.

Some cases of the method 1000 and the apparatus described herein may further include operations, features, means, or instructions for identifying that the second set of data may be the same as the first portion of the first set of data that remained after the second set of data was extracted from the first set of data, where validating the first portion may be based on identifying the second set of data may be the same as the first portion.

Some instances of the method 1000 and the apparatus described herein may further include operations, features, means, or instructions for inverting one or more bits of the second set of data based on a grey coding configuration of the first quantity of bits capable of being stored in each memory cell, where validating the first portion of the first set of data may be based on inverting one or more bits of the second set of data.

In some examples of the method 1000 and the apparatus described herein, at least a portion of the first portion of the first set of data may be the same as the inverted one or more bits of the second set of data.

In some cases of the method 1000 and the apparatus described herein, each of the one or more memory cells may be configured to store data associated with a set of pages, and each bit of the first set of data may be associated with one page of the set of pages.

Some instances of the method 1000 and the apparatus described herein may further include operations, features, means, or instructions for identifying a first subset of the set of pages associated with the first portion of the first set of data, and identifying a second subset of the set of pages disjoint from the first subset of the set of pages that may be associated with the second set of data, where extracting the second set of data from the first set of data may be based on identifying the first subset and the second subset.

Some examples of the method 1000 and the apparatus described herein may further include operations, features, means, or instructions for comparing the first portion of the first set of data to the second set of data, where validating the first portion of the first set of data using the second set of data may be based on the comparing.

Some cases of the method 1000 and the apparatus described herein may further include operations, features, means, or instructions for identifying a difference between the first portion of the first set of data and the second set of data, and performing an error correction procedure on the first portion of the first set of data based on identifying the difference, where validating the first portion of the first set of data may be based on performing the error correction procedure.

Figure 11:
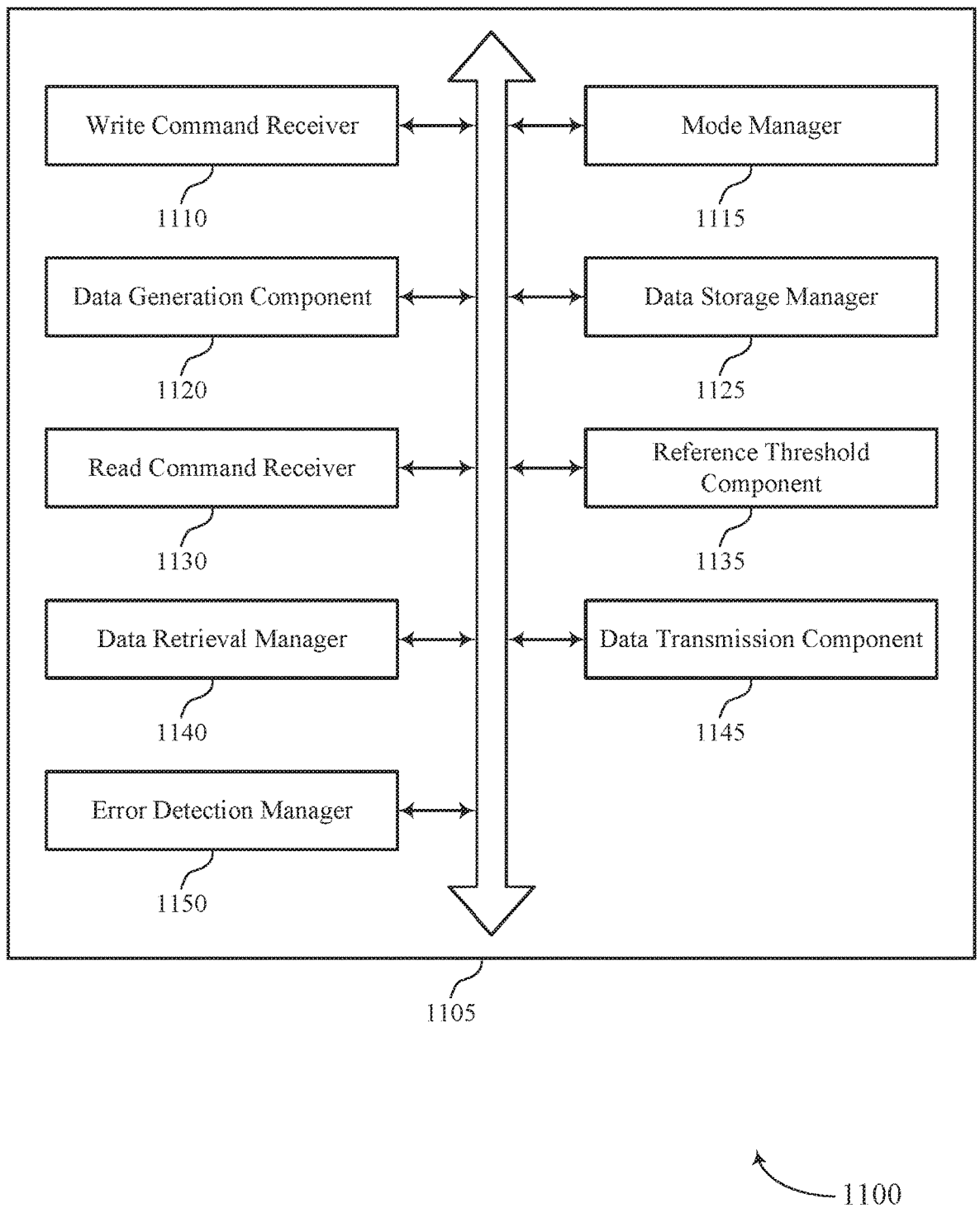
FIG. 11 shows a block diagram of a memory device that supports enhanced data reliability in multi-level memory cells in accordance with examples as disclosed herein.

FIG. 11 shows a block diagram 1100 of a memory device 1105 that supports enhanced data reliability in multi-level memory cells in accordance with examples as disclosed herein. The memory device 1105 may be an example of aspects of a memory device as described with reference to FIG. 1, FIG. 2, FIG. 6, and FIG. 7. The memory device 1105 may include a write command receiver 1110, a mode manager 1115, a data generation component 1120, a data storage manager 1125, a read command receiver 1130, a reference threshold component 1135, a data retrieval manager 1140, a data transmission component 1145, and an error detection manager 1150. Each of these components may communicate, directly or indirectly, with one another (e.g., via one or more buses).

The write command receiver 1110 may receive, from a host device, a write command indicating a first set of data to store in a memory array using one or more memory cells that are each configured to store multiple bits.

The mode manager 1115 may determine whether to operate in a first mode of operation associated with a reliability above a first threshold or a second mode of operation associated a storage capacity above a second threshold for executing the write command at the memory array based on receiving the write command. In some examples, the mode manager 1115 may identify, from a first mode of operation associated with a reliability above a first threshold and a second mode of operation associated with a storage capacity above a second threshold, the first mode of operation is associated with the read command. In some cases, the mode manager 1115 may identify an indication of the first mode of operation within the write command received from the host device, where determining whether to operate in the first mode of operation or the second mode of operation is based on identifying the indication of the first mode of operation within the write command. In some cases, the indication includes an opcode of the write command. In some instances, the mode manager 1115 may identify an indication of the first mode of operation within the read command received from the host device, where identifying the first mode of operation is based on identifying the indication of the first mode of operation within the read command. In some examples, the indication includes an opcode of the read command. In some cases, the mode manager 1115 may identify that the first set of data stored in the memory device is associated with the first mode of operation, where identifying the first mode of operation is based on identifying that the first set of data stored in the memory device is associated with the first mode of operation.

The data generation component 1120 may generate a second set of data for storing with the first set of data in the memory array based on determining to operate in the first mode of operation for executing the write command. In some examples, the data generation component 1120 may duplicate a portion of the first set of data, where generating the second set of data is based on duplicating the portion of the first set of data. In some examples, the data generation component 1120 may invert one or more bits of the duplicated portion of the first set of data to generate one or more bits of the second set of data based on a grey coding configuration of the multiple bits capable of being stored in each memory cell of the one or more memory cells.

In some examples, the data generation component 1120 may duplicate each bit of the first set of data that is associated with a first page of a set of pages to generate a first portion of the second set of data that is associated with a second page of the set of pages, where the second page is different from the first page. In some instances, the data generation component 1120 may duplicate each bit of the first set of data associated with a third page of the set of pages to generate a second portion of the second set of data associated with a fourth page of the set of pages, where the third page is different from the first page, the second page, and the fourth page. In some cases, the data generation component 1120 may duplicate each bit of the first set of data associated with the first page of the set of pages to generate a second portion of the second set of data associated with a third page of the set of pages, where the third page is different from the first page and the second page.

The data storage manager 1125 may store the first set of data and the second set of data within the one or more memory cells, where each a memory cell of the one or more memory cells stores multiple bits of data that includes at least one bit from the first set of data and at least one bit from the second set of data. In some cases, each of the one or more memory cells are configured to store data associated with a set of pages. In some instances, each bit of the multiple bits stored by each of the one or more memory cells is associated with one page of the set of pages. In some examples, the first set of data is associated with one or more pages of the set of pages. In some cases, the second set of data is associated with at least one page of the set of pages that is different than the one or more pages associated with the first set of data.

The read command receiver 1130 may receive, from a host device, a read command to retrieve a first set of data stored in the memory device using one or more memory cells that are each configured to store a set of bits.

The reference threshold component 1135 may select one or more reference thresholds based on identifying the first mode of operation. In some examples, the reference threshold component 1135 may select a set of reference thresholds including the one or more reference thresholds and at least one additional reference threshold different than the one or more reference thresholds based on detecting the error. In some cases, the one or more reference thresholds are a subset of a set of reference thresholds associated with the one or more memory cells.

The data retrieval manager 1140 may retrieve the first set of data from the one or more memory cells based on selecting the one or more reference thresholds. In some examples, the data retrieval manager 1140 may receive a subset of bits from the set of bits stored within each of the one or more memory cells, where the subset of bits are based on the one or more reference thresholds. In some cases, the data retrieval manager 1140 may retrieve a second set of data and the first set of data from the one or more memory cells based on selecting the set of reference thresholds.

The data transmission component 1145 may transmit the first set of data to the host device.

The error detection manager 1150 tray detect an error within the first set of data retrieved from the one or more memory cells. In some examples, the error detection manager 1150 may compare the second set of data to the first set of data. In some cases, the error detection manager 1150 may invert one or more bits within the first set of data based on comparing the second set of data to the first set of data, where transmitting the first set of data to the host device is based on inverting one or more bits within the first set of data. In some instances, the error detection manager 1150 may invert one or more bits of the second set of data based on a grey coding configuration of the set of bits capable of being stored in each memory cell of the one or more memory cells to generate a third set of data. In some examples, the error detection manager 1150 may compare the third set of data to the first set of data. In some cases, the error detection manager 1150 may invert one or more bits within the first set of data based on comparing the second set of data to the first set of data, where transmitting the first set of data to the host device is based on inverting one or more bits within the first set of data.

Figure 12:
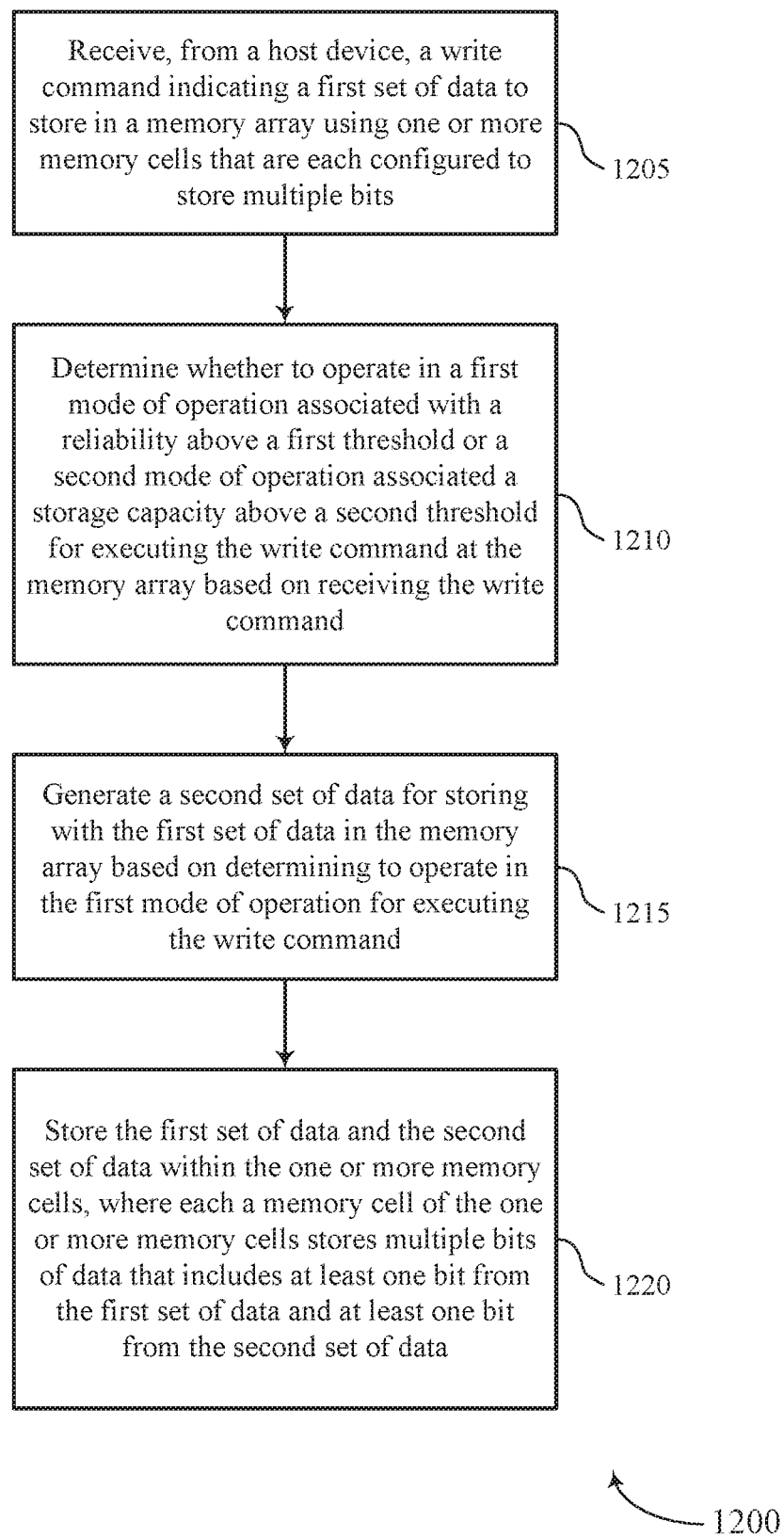
FIGS. 12 and 13 show flowcharts illustrating a method or methods that support enhanced data reliability in multi-level memory cells in accordance with examples as disclosed herein.

FIG. 12 shows a flowchart illustrating a method or methods 1200 that supports enhanced data reliability in multi-level memory cells in accordance with examples as disclosed herein. The operations of method 1200 may be implemented by a memory device or its components as described herein. For example, the operations of method 1200 may be performed by a memory device as described with reference to FIG. 11. In some examples, a memory device may execute a set of instructions to control the functional elements of the memory device to perform the described functions. Additionally or alternatively, a memory device may perform aspects of the described functions using special-purpose hardware.

At 1205, the memory device may receive, from a host device, a write command indicating a first set of data to store in a memory array using one or more memory cells that are each configured to store multiple bits. The operations of 1205 may be performed according to the methods described herein. In some examples, aspects of the operations of 1205 may be performed by a write command receiver as described with reference to FIG. 11.

At 1210, the memory device may determine whether to operate in a first mode of operation associated with a reliability above a first threshold or a second mode of operation associated a storage capacity above a second threshold for executing the write command at the memory array based on receiving the write command. The operations of 1210 may be performed according to the methods described herein. In some examples, aspects of the operations of 1210 may be performed by a mode manager as described with reference to FIG. 11.

At 1215, the memory device may generate a second set of data for storing with the first set of data in the memory array based on determining to operate in the first mode of operation for executing the write command. The operations of 1215 may be performed according to the methods described herein. In some examples, aspects of the operations of 1215 may be performed by a data generation component as described with reference to FIG. 11.

At 1220, the memory device may store the first set of data and the second set of data within the one or more memory cells, where each a memory cell of the one or more memory cells stores multiple bits of data that includes at least one bit from the first set of data and at least one bit from the second set of data. The operations of 1220 may be performed according to the methods described herein. In some examples, aspects of the operations of 1220 may be performed by a data storage manager as described with reference to FIG. 11.

In some examples, an apparatus as described herein may perform a method or methods, such as the method 1200. The apparatus may include features, means, or instructions (e.g., a non-transitory computer-readable medium storing instructions executable by a processor) for receiving, from a host device, a write command indicating a first set of data to store in a memory array using one or more memory cells that are each configured to store multiple bits, determining whether to operate in a first mode of operation associated with a reliability above a first threshold or a second mode of operation associated a storage capacity above a second threshold for executing the write command at the memory array based on receiving the write command, generating a second set of data for storing with the first set of data in the memory array based on determining to operate in the first mode of operation for executing the write command, and storing the first set of data and the second set of data within the one or more memory cells, where each a memory cell of the one or more memory cells stores multiple bits of data that includes at least one bit from the first set of data and at least one bit from the second set of data.

Some examples of the method 1200 and the apparatus described herein may further include operations, features, means, or instructions for identifying an indication of the first mode of operation within the write command received from the host device, where determining whether to operate in the first mode of operation or the second mode of operation may be based on identifying the indication of the first mode of operation within the write command.

In some cases of the method 1200 and the apparatus described herein, the indication includes an opcode of the write command.

Some instances of the method 1200 and the apparatus described herein may further include operations, features, means, or instructions for duplicating a portion of the first set of data, where generating the second set of data may be based on duplicating the portion of the first set of data.

Some examples of the method 1200 and the apparatus described herein may further include operations, features, means, or instructions for inverting one or more bits of the duplicated portion of the first set of data to generate one or more bits of the second set of data based on a grey coding configuration of the multiple bits capable of being stored in each memory cell of the one or more memory cells.

In some cases of the method 1200 and the apparatus described herein, each of the one or more memory cells may be configured to store data associated with a set of pages, and each bit of the multiple bits stored by each of the one or more memory cells may be associated with one page of the set of pages.

In some instances of the method 1200 and the apparatus described herein, the first set of data may be associated with one or more pages of the set of pages, and the second set of data may be associated with at least one page of the set of pages that may be different than the one or more pages associated with the first set of data.

Some examples of the method 1200 and the apparatus described herein may further include operations, features, means, or instructions for duplicating each bit of the first set of data that may be associated with a first page of a set of pages to generate a first portion of the second set of data that may be associated with a second page of the set of pages, where the second page may be different from the first page.

Some cases of the method 1200 and the apparatus described herein may further include operations, features, means, or instructions for duplicating each bit of the first set of data associated with a third page of the set of pages to generate a second portion of the second set of data associated with a fourth page of the set of pages, where the third page may be different from the first page, the second page, and the fourth page.

Some instances of the method 1200 and the apparatus described herein may further include operations, features, means, or instructions for duplicating each bit of the first set of data associated with the first page of the set of pages to generate a second portion of the second set of data associated with a third page of the set of pages, where the third page may be different from the first page and the second page.

Figure 13:
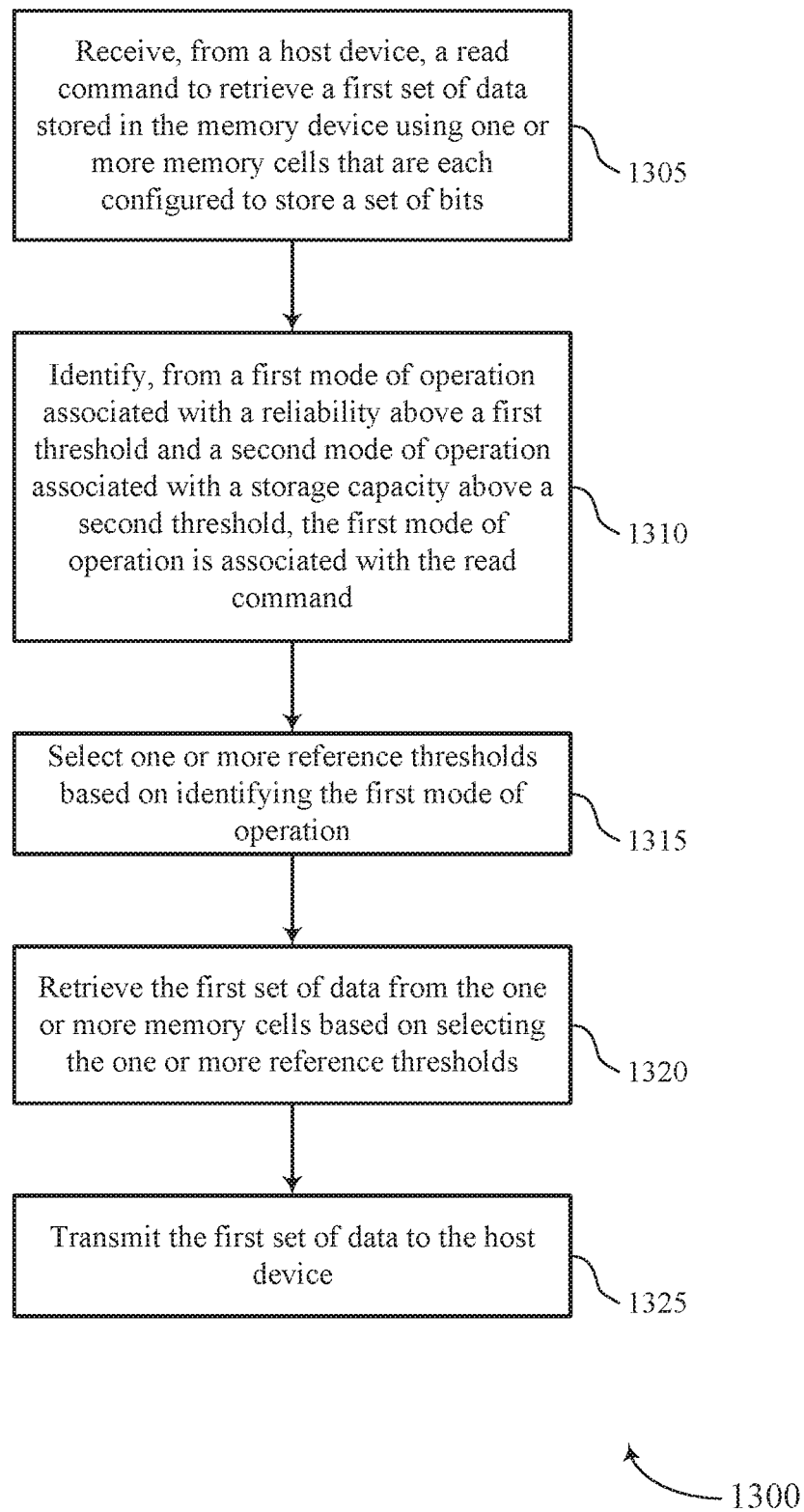

FIG. 13 shows a flowchart illustrating a method or methods 1300 that supports enhanced data reliability in multi-level memory cells in accordance with examples as disclosed herein. The operations of method 1300 may be implemented by a memory device or its components as described herein. For example, the operations of method 1300 may be performed by a memory device as described with reference to FIG. 11. In some examples, a memory device may execute a set of instructions to control the functional elements of the memory device to perform the described functions. Additionally or alternatively, a memory device may perform aspects of the described functions using special-purpose hardware.

At 1305, the memory device may receive, from a host device, a read command to retrieve a first set of data stored in the memory device using one or more memory cells that are each configured to store a set of bits. The operations of 1305 may be performed according to the methods described herein. In some examples, aspects of the operations of 1305 may be performed by a read command receiver as described with reference to FIG. 11.

At 1310, the memory device may identify, from a first mode of operation associated with a reliability above a first threshold and a second mode of operation associated with a storage capacity above a second threshold, the first mode of operation is associated with the read command. The operations of 1310 may be performed according to the methods described herein. In some examples, aspects of the operations of 1310 may be performed by a mode manager as described with reference to FIG. 11.

At 1315, the memory device may select one or more reference thresholds based on identifying the first mode of operation. The operations of 1315 may be performed according to the methods described herein. In some examples, aspects of the operations of 1315 may be performed by a reference threshold component as described with reference to FIG. 11.

At 1320, the memory device may retrieve the first set of data from the one or more memory cells based on selecting the one or more reference thresholds. The operations of 1320 may be performed according to the methods described herein. In some examples, aspects of the operations of 1320 may be performed by a data retrieval manager as described with reference to FIG. 11.

At 1325, the memory device may transmit the first set of data to the host device. The operations of 1325 may be performed according to the methods described herein. In some examples, aspects of the operations of 1325 may be performed by a data transmission component as described with reference to FIG. 11.

In some examples, an apparatus as described herein may perform a method or methods, such as the method 1300. The apparatus may include features, means, or instructions (e.g., a non-transitory computer-readable medium storing instructions executable by a processor) for receiving, from a host device, a read command to retrieve a first set of data stored in the memory device using; one or more memory cells that are each configured to store a set of bits, identifying, from a first mode of operation associated with a reliability above a first threshold and a second mode of operation associated with a storage capacity above a second threshold, the first mode of operation is associated with the read command, selecting; one or more reference thresholds based on identifying the first mode of operation, retrieving the first set of data from the one or more memory cells based on selecting the one or more reference thresholds, and transmitting the first set of data to the host device.

In some examples of the method 1300 and the apparatus described herein, the one or more reference thresholds may be a subset of a set of reference thresholds associated with the one or more memory cells.

In some cases of the method 1300 and the apparatus described herein, retrieving the first set of data further may include operations, features, means, or instructions for receiving a subset of bits from the set of bits stored within each of the one or more memory cells, where the subset of bits may be based on the one or more reference thresholds.

Some instances of the method 1300 and the apparatus described herein may further include operations, features, means, or instructions for detecting an error within the first set of data retrieved from the one or more memory cells, selecting a set of reference thresholds including the one or more reference thresholds and at least one additional reference threshold different than the one or more reference thresholds based on detecting the error, and retrieving a second set of data and the first set of data from the one or more memory cells based on selecting the set of reference thresholds.

Some examples of the method 1300 and the apparatus described herein may further include operations, features, means, or instructions for comparing the second set of data to the first set of data, and inverting one or more bits within the first set of data based on comparing the second set of data to the first set of data, where transmitting the first set of data to the host device may be based on inverting one or more bits within the first set of data.

Some cases of the method 1300 and the apparatus described herein may further include operations, features, means, or instructions for inverting one or more bits of the second set of data based on a grey coding configuration of the set of bits capable of being stored in each memory cell of the one or more memory cells to generate a third set of data, comparing the third set of data to the first set of data, and inverting one or more bits within the first set of data based on comparing the second set of data to the first set of data, where transmitting the first set of data to the host device may be based on inverting one or more bits within the first set of data.

Some instances of the method 1300 and the apparatus described herein may further include operations, features, means, or instructions for identifying an indication of the first mode of operation within the read command received from the host device, where identifying the first mode of operation may be based on identifying the indication of the first mode of operation within the read command.

In some examples of the method 1300 and the apparatus described herein, the indication includes an opcode of the read command.

Some cases of the method 1300 and the apparatus described herein may further include operations, features, means, or instructions for identifying that the first set of data stored in the memory device may be associated with the first mode of operation, where identifying the first mode of operation may be based on identifying that the first set of data stored in the memory device may be associated with the first mode of operation.

It should be noted that the methods described above describe possible implementations, and that the operations and the steps may be rearranged or otherwise modified and that other implementations are possible. Furthermore, portions from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type HT. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks, components, and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A non-transitory computer-readable medium storing code comprising instructions executable by one or more processors to:
   transmit, to a memory device, a read command to retrieve a first set of data stored in the memory device using one or more memory cells that are each configured to store a first quantity of two or more bits;
   receive, from the memory device, the first set of data based at least in part on transmitting the read command;
   extract a second set of data from the first set of data, the second set of data comprising a second quantity of bits associated with each memory cell that is less than the first quantity of two or more bits included in the first set of data; and
   validate, using the second set of data, a first portion of the first set of data that remains after the second set of data was extracted.

2. The non-transitory computer-readable medium of claim 1, wherein the instructions are further executable by the one or more processors to:
   identify that the second set of data is the same as the first portion of the first set of data that remained after the second set of data was extracted from the first set of data, wherein validating the first portion is based at least in part on identifying the second set of data is the same as the first portion.

3. The non-transitory computer-readable medium of claim 1, wherein the instructions are further executable by the one or more processors to:
   invert one or more bits of the second set of data based at least in part on a grey coding configuration of the first quantity of two or more bits capable of being stored in each memory cell, wherein validating the first portion of the first set of data is based at least in part on inverting one or more bits of the second set of data.

4. The non-transitory computer-readable medium of claim 3, wherein at least a portion of the first portion of the first set of data is the same as the inverted one or more bits of the second set of data.

5. The non-transitory computer-readable medium of claim 1, wherein:
   each of the one or more memory cells are configured to store data associated with a plurality of pages; and
   each bit of the first set of data is associated with one page of the plurality of pages.

6. The non-transitory computer-readable medium of claim 5, wherein the instructions are further executable by the one or more processors to:
   identify a first subset of the plurality of pages associated with the first portion of the first set of data; and
   identify a second subset of the plurality of pages disjoint from the first subset of the plurality of pages that is associated with the second set of data, wherein extracting the second set of data from the first set of data is based at least in part on identifying the first subset and the second subset.

7. The non-transitory computer-readable medium of claim 1, wherein the instructions are further executable by the one or more processors to:
   compare the first portion of the first set of data to the second set of data, wherein validating the first portion of the first set of data using the second set of data is based at least in part on the comparing.

8. The non-transitory computer-readable medium of claim 1, wherein the instructions are further executable by the one or more processors to:
   identify a difference between the first portion of the first set of data and the second set of data; and
   perform an error correction procedure on the first portion of the first set of data based at least in part on identifying the difference, wherein validating the first portion of the first set of data is based at least in part on performing the error correction procedure.

9. A memory system, comprising:
   one or more control components configured to be coupled with one or more memory devices, wherein the one or more control components are operable to cause the memory system to:
     transmit, to a memory device, a read command to retrieve a first set of data stored in the memory device using one or more memory cells that are each configured to store a first quantity of two or more bits;
     receive, from the memory device, the first set of data based at least in part on transmitting the read command;
     extract a second set of data from the first set of data, the second set of data comprising a second quantity of bits associated with each memory cell that is less than the first quantity of two or more bits included in the first set of data; and
     validate, using the second set of data, a first portion of the first set of data that remains after the second set of data was extracted.

10. The memory system of claim 9, wherein the one or more control components is further operable to cause the memory system to:
    identify that the second set of data is the same as the first portion of the first set of data that remained after the second set of data was extracted from the first set of data, wherein validating the first portion is based at least in part on identifying the second set of data is the same as the first portion.

11. The memory system of claim 9, wherein the one or more control components is further operable to cause the memory system to:
    invert one or more bits of the second set of data based at least in part on a grey coding configuration of the first quantity of two or more bits capable of being stored in each memory cell, wherein validating the first portion of the first set of data is based at least in part on inverting one or more bits of the second set of data.

* * * * *